(12) United States Patent
Van Slyke et al.

(10) Patent No.: US 6,513,451 B2
(45) Date of Patent: Feb. 4, 2003

(54) CONTROLLING THE THICKNESS OF AN ORGANIC LAYER IN AN ORGANIC LIGHT-EMITING DEVICE

(75) Inventors: Steven A. Van Slyke, Pittsford, NY (US); Michael A. Marcus, Honeoye Falls, NY (US); John P. Spoonhower, Webster, NY (US); Robert G. Spahn, Webster, NY (US); Dennis R. Freeman, Spencerport, NY (US)

(73) Assignee: Eastman Kodak Company, Rochester, NY (US)

( * ) Notice: Subject to any disclaimer, the term of this patent is extended or adjusted under 35 U.S.C. 154(b) by 96 days.

(21) Appl. No.: 09/839,885

(22) Filed: Apr. 20, 2001

(65) Prior Publication Data

US 2002/0189542 A1 Dec. 19, 2002

(51) Int. Cl.[7] ............................................. C23C 16/448
(52) U.S. Cl. .............................. 118/723 VE; 118/726; 118/719; 118/722; 118/723 R
(58) Field of Search ................................ 118/726, 727, 118/723 VE, 723 AN, 723 DC, 723 E, 723 EB, 723 FE, 728, 730; 219/420, 121.52, 121.58, 121.59; 204/298.41, 298.28; 427/248.1, 294, 523, 571; 216/27

(56) References Cited

U.S. PATENT DOCUMENTS

| | | | | |
|---|---|---|---|---|
| 3,570,449 A | * | 3/1971 | Blecherman et al. ....... | 118/664 |
| 3,586,854 A | * | 6/1971 | Zega ........................... | 118/664 |
| 3,612,859 A | * | 10/1971 | Schumacher ................ | 118/689 |
| 3,651,781 A | * | 3/1972 | Brill et al. .................. | 118/726 |
| 3,734,620 A | * | 5/1973 | Cade ........................... | 118/690 |
| 3,971,334 A | * | 7/1976 | Pundsack .................... | 118/719 |
| 3,974,059 A | * | 8/1976 | Murayama .................. | 118/726 |
| 4,036,167 A | * | 7/1977 | Lu ............................... | 118/689 |
| 4,311,725 A | * | 1/1982 | Holland ....................... | 118/664 |
| 4,356,429 A | | 10/1982 | Tang ........................... | 313/504 |
| 4,539,507 A | | 9/1985 | VanSlyke et al. ......... | 252/301.21 |
| 4,720,432 A | | 1/1988 | VanSlyke et al. ......... | 252/301.16 |
| 4,769,292 A | | 9/1988 | Tang et al. ................. | 313/504 |
| 5,288,328 A | * | 2/1994 | Nouvelot et al. ........... | 118/715 |
| 5,550,066 A | | 8/1996 | Tang et al. ........ | 148/DIG. 150 |
| 5,656,138 A | * | 8/1997 | Scobey et al. ......... | 204/192.13 |
| 5,863,379 A | * | 1/1999 | Uchida et al. .............. | 156/182 |
| 5,976,263 A | * | 11/1999 | Poole .......................... | 118/726 |
| 6,237,529 B1 | * | 5/2001 | Spahn .................. | 118/723 VE |
| 6,337,105 B1 | * | 1/2002 | Kunieda et al. ............ | 118/50.1 |

* cited by examiner

Primary Examiner—Gregory Mills
Assistant Examiner—Rudy Zervigon
(74) Attorney, Agent, or Firm—Raymond L. Owens

(57) ABSTRACT

Apparatus for monitoring and controlling formation of organic layers by physical vapor deposition of organic materials in making organic light-emitting devices is disclosed.

32 Claims, 18 Drawing Sheets

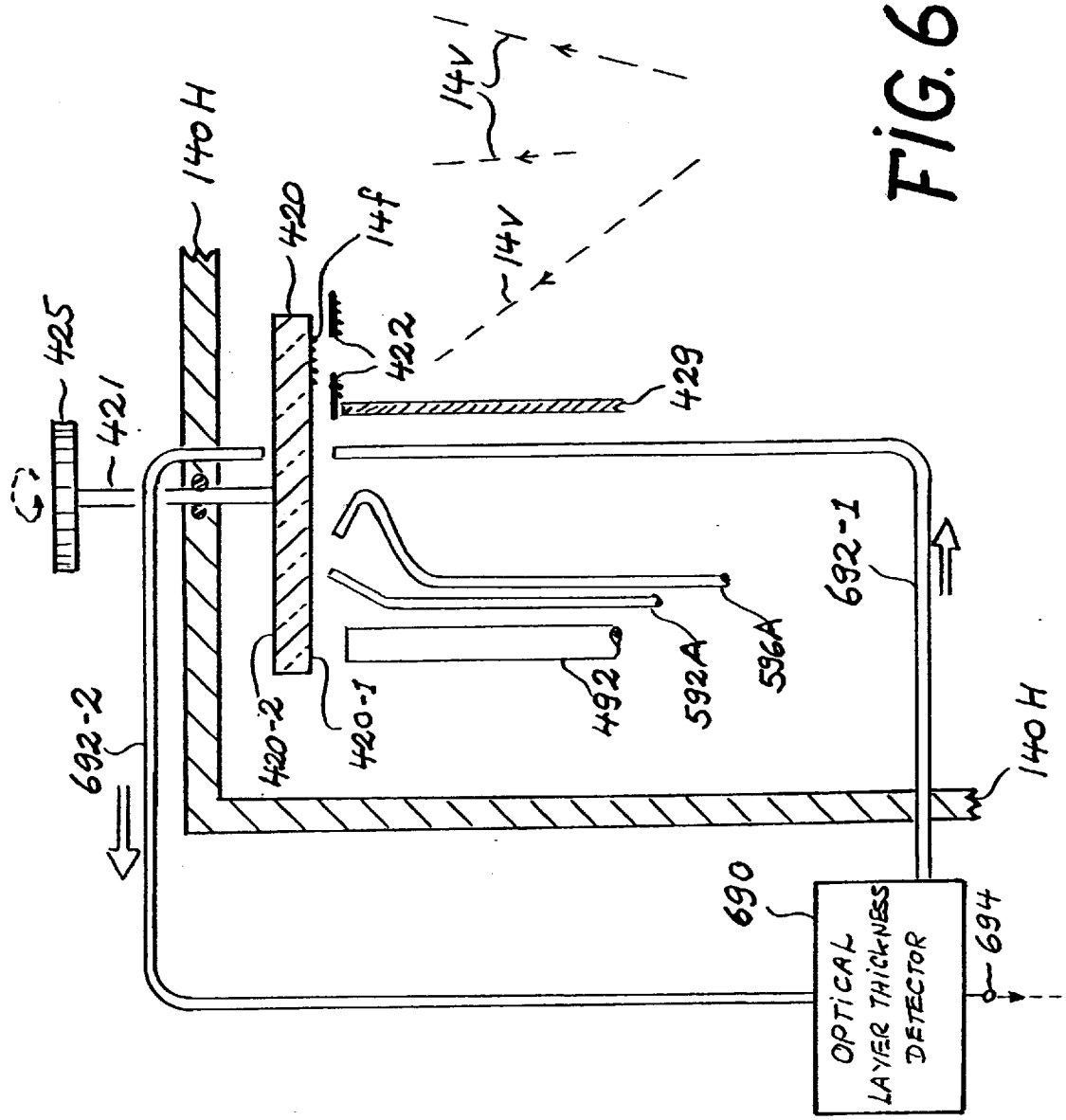

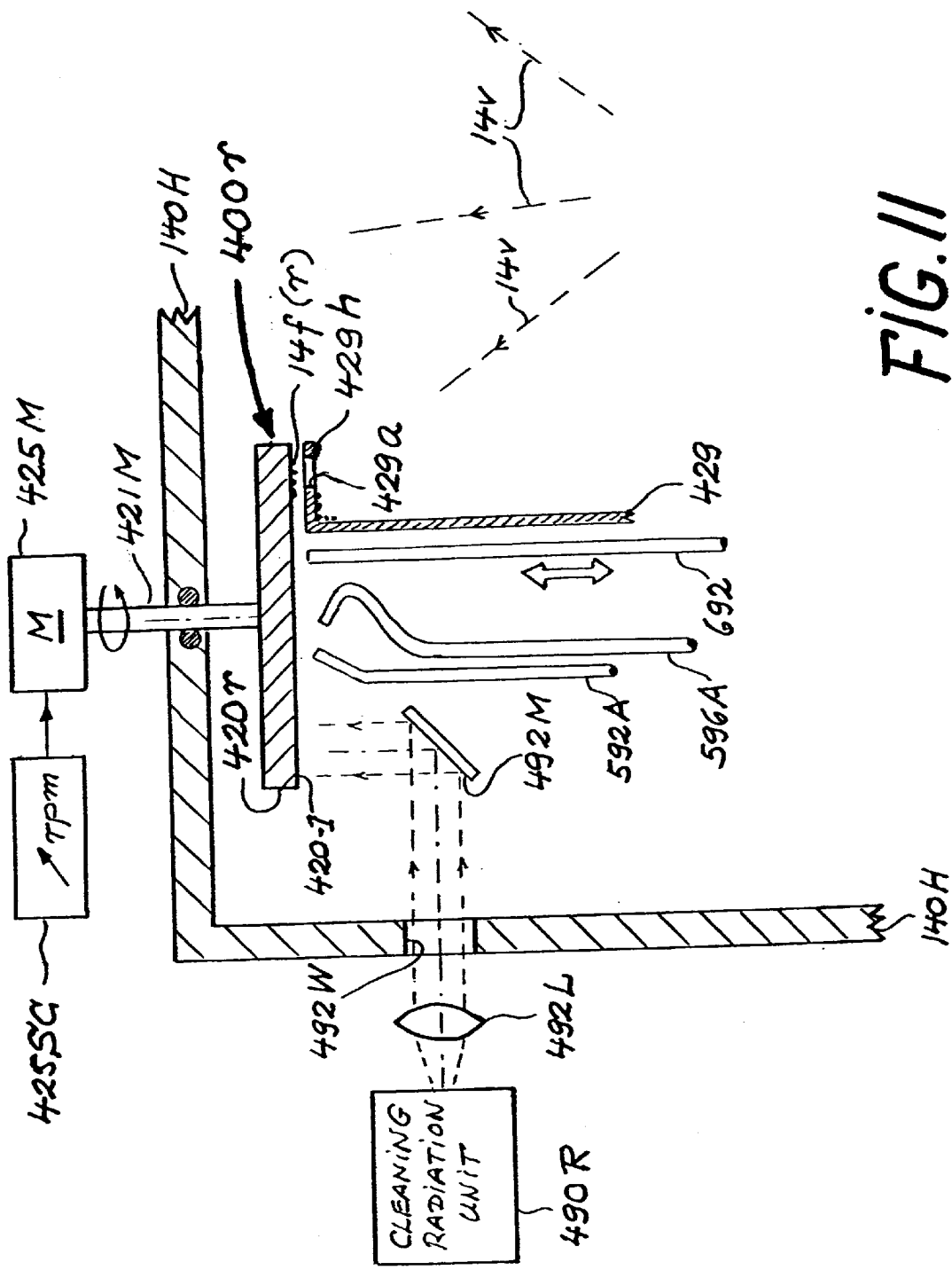

CONTROLLING THE THICKNESS OF AN ORGANIC LAYER IN AN ORGANIC LIGHT-EMITTING DEVICE

CROSS REFERENCE TO RELATED APPLICATIONS

Reference is made to commonly assigned U.S. patent application Ser. No. 09/839,886 filed concurrently herewith entitled "Reusable Mass-Sensor in Manufacture of Organic Light-Emitting Devices" by Michael A. Marcus et al., the disclosure of which is incorporated herein by reference.

FIELD OF THE INVENTION

The present invention relates generally to monitoring and controlling formation of organic layers by physical vapor deposition in making organic light-emitting devices.

BACKGROUND OF THE INVENTION

An organic light-emitting device, also referred to as an organic electroluminescent device, can be constructed by sandwiching two or more organic layers between first and second electrodes.

In a passive matrix organic light-emitting device of conventional construction, a plurality of laterally spaced light-transmissive anodes, for example indium-tin-oxide (ITO) anodes are formed as first electrodes on a light-transmissive substrate such as, for example, a glass substrate. Two or more organic layers are then formed successively by vapor deposition of respective organic materials from respective sources, within a chamber held at reduced pressure, typically less than $10^{-3}$ Torr. A plurality of laterally spaced cathodes are deposited as second electrodes over an uppermost one of the organic layers. The cathodes are oriented at an angle, typically at a right angle, with respect to the anodes.

Such conventional passive matrix organic light-emitting devices are operated by applying an electrical potential (also referred to as a drive voltage) between an individual row (cathode) and, sequentially, each column (anode). When a cathode is biased negatively with respect to an anode, light is emitted from a pixel defined by an overlap area of the cathode and the anode, and emitted light reaches an observer through the anode and the substrate.

In an active matrix organic light-emitting device, an array of anodes are provided as first electrodes by thin-film transistors (TFTS) which are connected to a respective light-transmissive portion. Two or more organic layers are formed successively by vapor deposition in a manner substantially equivalent to the construction of the aforementioned passive matrix device. A common cathode is deposited as a second electrode over an uppermost one of the organic layers. The construction and function of an active matrix organic light-emitting device is described in U.S. Pat. No. 5,550,066, the disclosure of which is herein incorporated by reference.

Organic materials, thicknesses of vapor-deposited organic layers, and layer configurations, useful in constructing an organic light-emitting device, are described, for example, in U.S. Pat. Nos. 4,356,429; 4,539,507; 4,720,432; and 4,769,292, the disclosures of which are herein incorporated by reference.

In order to provide an organic light-emitting device which is substantially defect-free, i.e. free of non-emitting dark defects or of highly emitting bright defects, the formation of organic layers of the device has to be monitored or controlled. Such control of vapor deposition of organic layers by sublimation or evaporation of organic material from a source is typically achieved by positioning a monitor device within the same vapor deposition zone in which the substrate or structure is to be coated with the organic layer. Thus, the monitor device receives an organic layer at the same time as the organic layer is being formed on the substrate or structure. The monitor device, in turn, provides an electrical signal which is responsive to a rate at which the organic layer is being formed on the monitor device and, therefore, related to a rate at which the organic layer is being formed on the substrate or structure which will provide the organic light-emitting device. The electrical signal of the monitor device is processed and/or amplified, and is used to control the rate of vapor deposition and the thickness of the organic layer being formed on the device substrate or structure by adjusting a vapor source temperature control element, such as, for example, a source heater.

Well-known monitor devices are so-called crystal mass-sensor devices in which the monitor is a quartz crystal having two opposing electrodes. The crystal is part of an oscillator circuit provided in a deposition rate monitor. Within an acceptable range, a frequency of oscillation of the oscillator circuit is approximately inversely proportional to a mass-loading on a surface of the crystal occasioned by a layer or by multiple layers of material deposited on the crystal. When the acceptable range of mass-loading of the crystal is exceeded, for example by build-up of an excess number of deposited layers, the oscillator circuit can no longer function reliably, necessitating replacement of the "overloaded" crystal with a new crystal mass-sensor. Such replacement, in turn, requires discontinuation of the vapor deposition process.

In addition, when certain organic layers are deposited onto crystal mass-sensor devices there can be a tendency for the layers to start cracking and flaking from the mass sensor surface after coating thickness build-up on the order of 500–2,000 nanometer (nm). This can cause the crystal mass-sensor to become inaccurate in its coating rate measurement capability at thicknesses well below the aforementioned mass loading limit.

In development efforts, several organic light-emitting devices can typically be prepared before a crystal mass-sensor must be replaced due to excessive mass-loading or cracking and flaking of deposited layers. This does not present a problem in such efforts, since other considerations usually require disruption of vapor deposition by opening the deposition chamber for manual replacement of substrates or structures, replenishment of organic material in relatively small vapor sources, and the like.

However, in a manufacturing environment, designed for repeatedly making a relatively large number of organic light-emitting devices, replacement of "overloaded" crystal mass-sensors or of crystal mass-sensors having cracked or flaking organic layers would constitute a serious limitation because a manufacturing system is configured in all aspects to provide the capacity of producing all organic layers on numerous device structures and, indeed, to produce fully encapsulated organic light-emitting devices.

SUMMARY OF THE INVENTION

It is therefore an object of the present invention to efficiently deposit an evaporated or sublimed organic layer onto a structure which will form part of an organic light-emitting device.

This object is achieved by an apparatus for depositing an evaporated or sublimed organic layer onto a structure which will provide part of an organic light-emitting device, comprising:

a) a housing defining a chamber and a pump connected to the chamber for reducing the pressure therein;

b) a source for receiving organic material to be evaporated or sublimed and means connected to the source for adjusting the temperature thereof to control the rate at which the organic material is evaporated or sublimed;

c) means for positioning the structure so that such structure is located spaced from the source in a deposition zone;

d) a moving member moving through a plurality of positions along a path of motion;

e) the moving member in a first position having a portion thereof positioned in the deposition zone for receiving organic material from the source at the same time such organic material is deposited onto the structure;

f) first optical sensing means in a second position disposed relative to the moving member outside the deposition zone for sensing a thickness of the organic material deposited on the portion of the moving member;

g) electrical means connected to the first optical sensing means and responsive to the thickness of the organic material sensed by the first optical sensing means;

h) means for adjusting the temperature control means to control the rate of deposition and the thickness of the organic layer formed on the structure; and i) cleaning means disposed in a third position along the path of motion of the member outside the deposition zone beyond the first optical sensing means for removing in whole or in part organic material deposited on the portion of the member so that such portion can be reused in the deposition zone.

BRIEF DESCRIPTION OF THE DRAWINGS

FIGS. 6A and 6B depict schematically partial sectional views of the housing of FIG. 6 in which distinguishing features of the rotatable disc and of optical fiber conduits are shown, in accordance with aspects of the invention, wherein FIG. 6A shows an optically opaque disc which includes a reflective front surface, and optical fiber conduits (for determining a fluorescence efficacy of organic light-emitting material formed on a portion of the front surface) are directed towards the front surface at oblique angles; and FIG. 6B shows an optically transmissive disc which permits optical detection of a thickness of organic material formed on a portion of the disc by light transmitted through the disc;

FIGS. 7A–7D are schematic plan views of the rotatable disc of FIG. 6 in which the positions of the deposition zone, the optical sensing, and the cleaning are indicated along a rotational path of motion of the disc, wherein FIG. 7A shows a first deposition of organic light-emitting material in the deposition zone via an aperture in a shutter which is opened for a first time interval;

FIG. 7B shows the first deposition rotated outside the deposition zone into a position for optical determination of a thickness of the first deposition, with the shutter depicted in a closed position;

FIG. 7C shows the first deposition rotated into a position for optical determination of an efficacy of luminescence or of fluorescence of the light-emitting material, as a second deposition of organic light-emitting material is provided in the deposition zone via the shutter aperture which is opened of a second time interval; and FIG. 7D shows the first deposition rotated into a cleaning position for removal of the organic material, with the second deposition in the position for optical thickness determination;

FIG. 11 is a partial sectional view of the housing of FIG. 6 in which a rotating disc assembly includes a continuously rotating disc and cleaning radiation is directed towards the rotating disc through a window in the housing and via a mirror, in accordance with an aspect of the present invention;

FIGS. 12A–12C are schematic plan views of the rotating disc of FIG. 11 which rotates continuously over an aperture in a deposition zone and past optical sensing positions and a cleaning position, wherein FIG. 12A shows a circular band of organic light-emitting material deposited on the disc during one rotation over the aperture, and cleaning in the cleaning position is not actuated;

FIG. 12B shows the circular band of organic light-emitting material deposited on the disc following a second rotation over the aperture, and cleaning in the cleaning position is not actuated; and FIG. 12C shows the circular band of organic light-emitting material deposited on the disc following an n-th rotation over the aperture corresponding to a thickness of a completed organic light-emitting layer, with removal of organic material from the disc now being actuated in the cleaning position;

The drawings are necessarily of a schematic nature since layer thickness dimensions of OLEDs are frequently in the sub-micrometer ranges, while features representing lateral device dimensions can be in a range of 50–500 millimeter. Accordingly, the drawings are scaled for ease of visualization rather than for dimensional accuracy.

The term "substrate" denotes a light-transmissive support having a plurality of laterally spaced first electrodes (anodes) preformed thereon, such substrate being a precursor of a passive matrix OLED. The term "structure" is used to describe the substrate once it has received a portion of a vapor deposited organic layer, and to denote an active matrix array as a distinction over a passive matrix precursor.

DETAILED DESCRIPTION OF THE INVENTION

Figure 1:
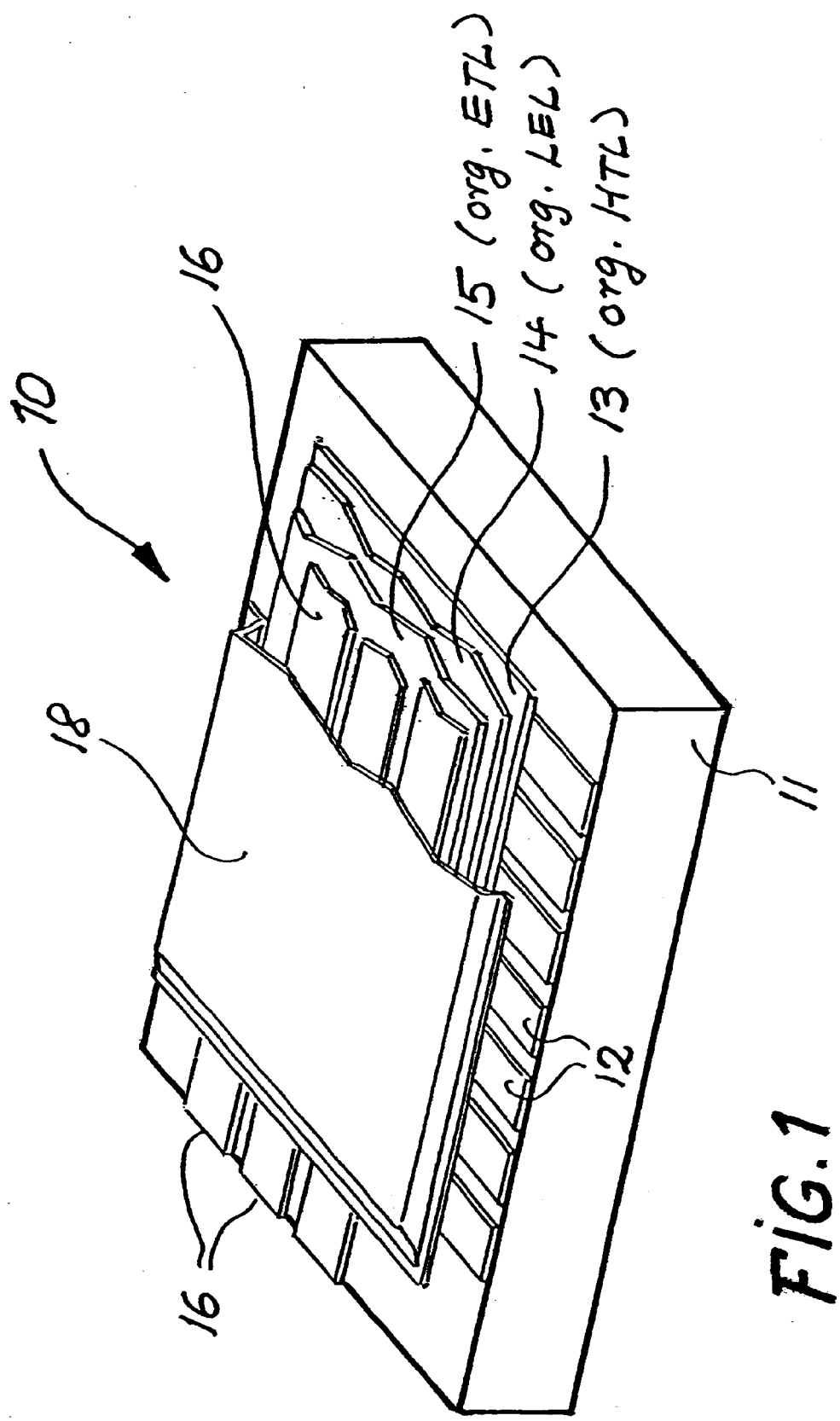
FIG. 1 is a schematic perspective view of a passive matrix organic light-emitting device (OLED) having partially peeled-back elements to reveal various layers.

Turning to FIG. 1, a schematic perspective view of a passive matrix organic light-emitting device (OLED) 10 is shown having partially peeled-back elements to reveal various layers.

A light-transmissive substrate 11 has formed thereon a plurality of laterally spaced first electrodes 12 (also referred to as anodes). An organic hole-transporting layer (HTL) 13, an organic light-emitting layer (LEL) 14, and an organic electron-transporting layer (ETL) 15 are formed in sequence by a physical vapor deposition, as will be described in more detail hereinafter. A plurality of laterally spaced second electrodes 16 (also referred to as cathodes) are formed over the organic electron-transporting layer 15, and in a direction substantially perpendicular to the first electrodes 12. An encapsulation or cover 18 seals environmentally sensitive portions of the structure, thereby providing a completed OLED 10.

Figure 2:
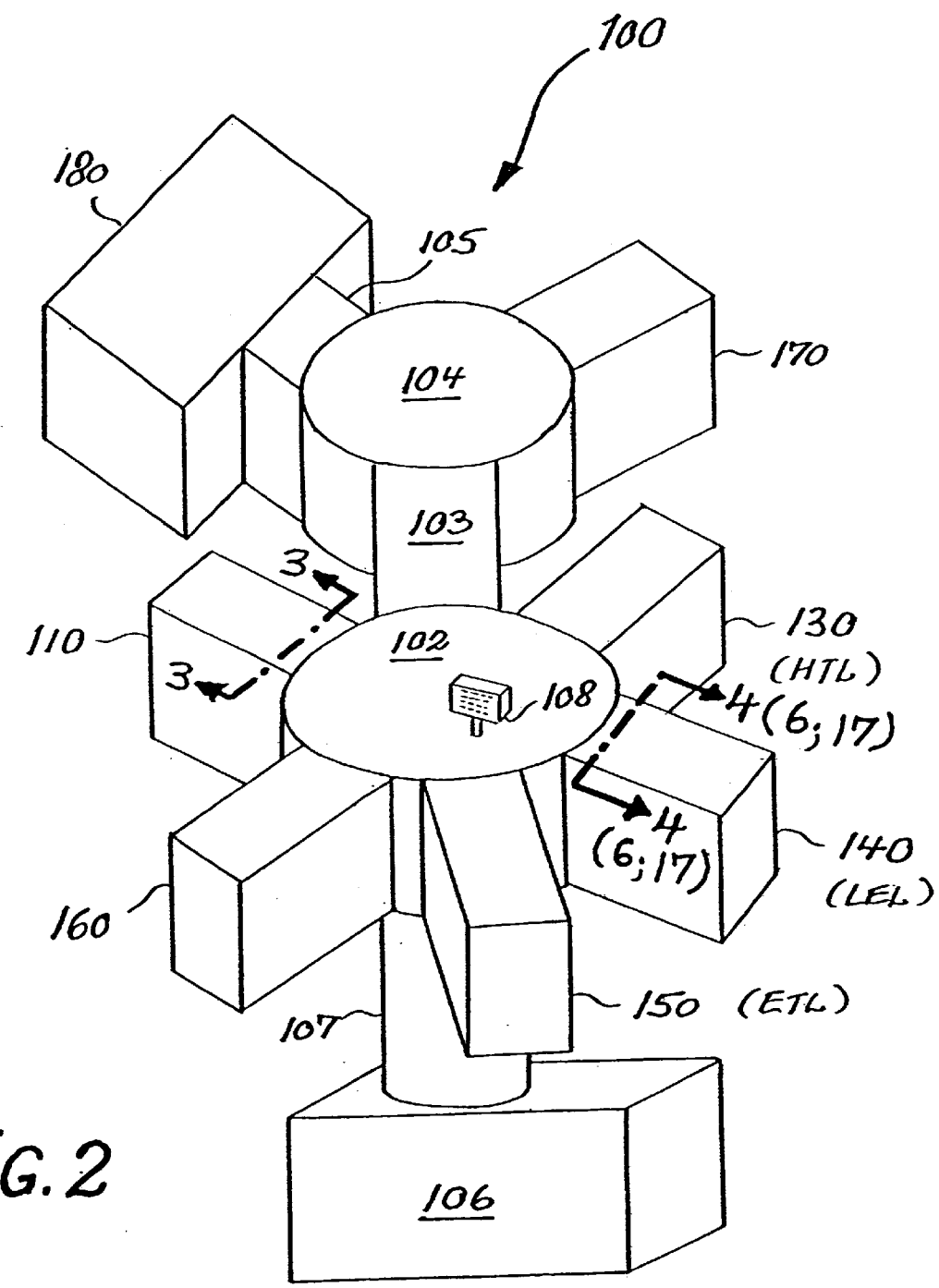
FIG. 2 is a schematic perspective view of a manufacturing system suitable for manufacture of a relatively large number of organic light-emitting devices (OLEDs) and having a plurality of stations extending from hubs.

Turning to FIG. 2, a schematic perspective view of a manufacturing system 100 is shown which is suitable for manufacture of a relatively large number of organic light-emitting devices using automated or robotic means (not shown) for transporting or transferring substrates or structures among a plurality of stations extending from a buffer hub 102 and from a transfer hub 104. A vacuum pump 106 via a pumping port 107 provides reduced pressure within the hubs 102, 104, and within each of the stations extending from these hubs. A pressure gauge 108 indicates the reduced pressure within the system 100. The pressure can be in a range from about $10^{-3}$ to $10^{-6}$ Torr.

The stations include a load station 110 for providing a load of substrates or structures, a vapor deposition station 130 dedicated to forming organic hole-transporting layers (HTL), a vapor deposition station 140 dedicated to forming organic light-emitting layers (LEL), a vapor deposition station 150 dedicated to forming organic electron-transporting layers (ETL), a vapor deposition station 160 dedicated to forming the plurality of second electrodes (cathodes), an unload station 103 for transferring structures from the buffer hub 102 to the transfer hub 104 which, in turn, provides a storage station 170, and an encapsulation station 180 connected to the hub 104 via a connector port 105. Each of these stations has an open port extending into the hubs 102 and 104, respectively, and each station has a vacuum-sealed access port (not shown) to provide access to a station for cleaning, replenishing materials, and for replacement or repair of parts. Each station includes a housing which defines a chamber.

Figure 3:
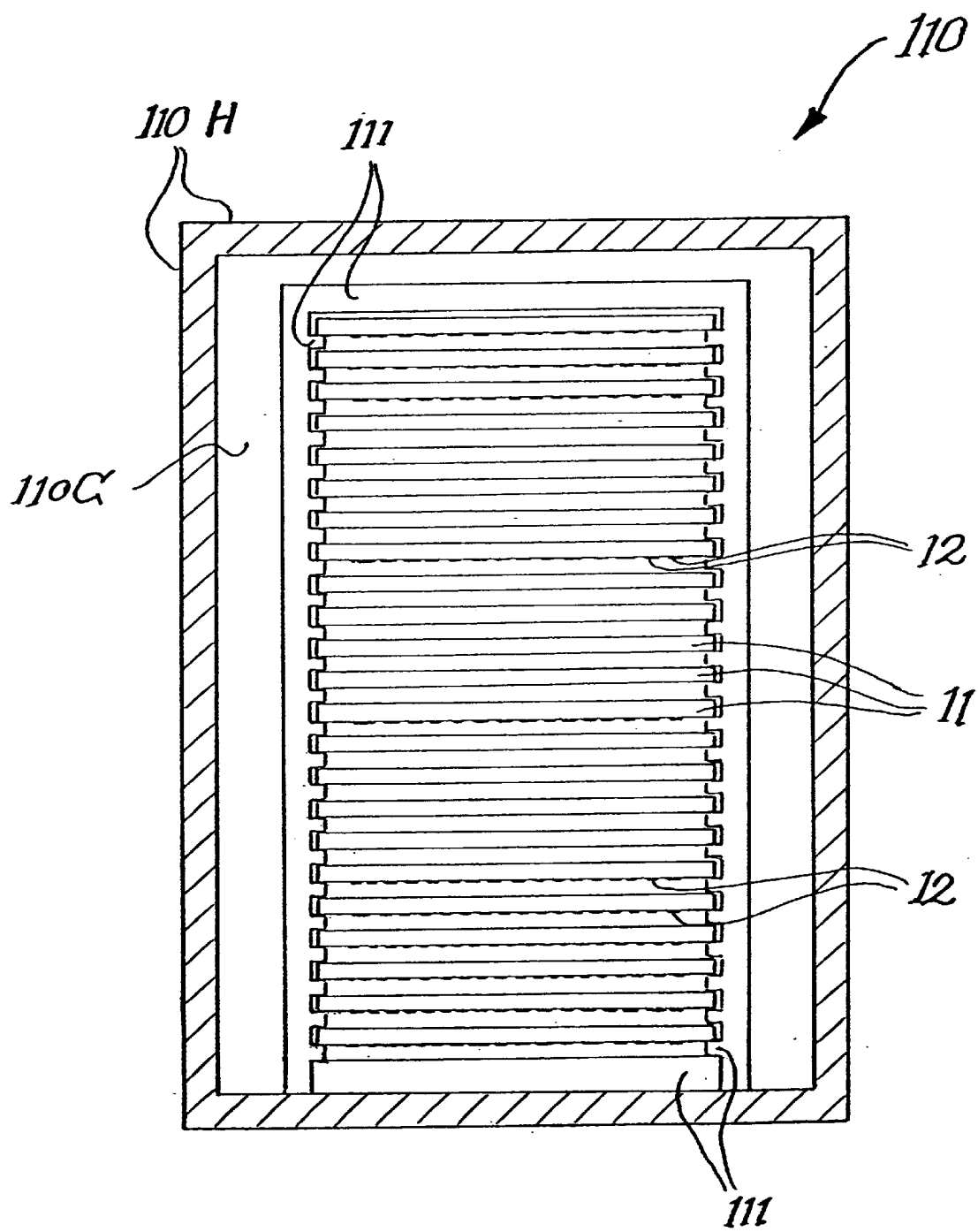
FIG. 3 is a schematic sectional view of a carrier containing a relatively large number of substrates or structures, and positioned in a load station of the system of FIG. 2 as indicated by section lines 3—3 in FIG. 2.

FIG. 3 is a schematic sectional view of the load station 110, taken along section lines 3—3 of FIG. 2. The load station 110 has a housing 110H which defines a chamber 110C. Within the chamber is positioned a carrier 111 designed to carry a plurality of substrates 11 having preformed first electrodes 12 (see FIG. 1). An alternative carrier 111 can be provided for supporting a plurality of active matrix structures. Carriers 111 can also be provided in the unload station 103 and in the storage station 170.

Figure 4:
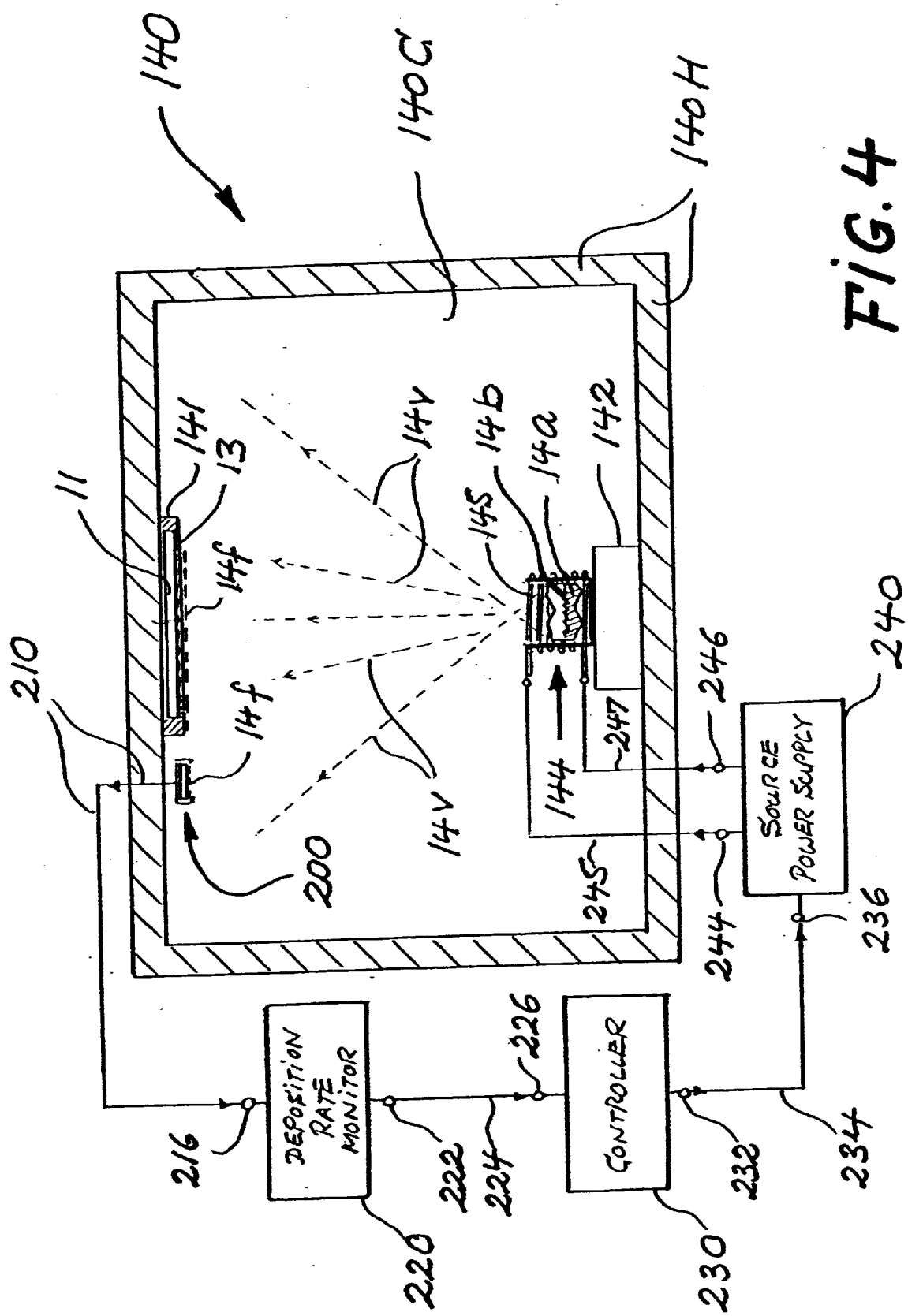
FIG. 4 is a schematic sectional view of a vapor deposition station dedicated to forming vapor deposited organic light-emitting layers (LEL) on a structure in the system of FIG. 2 as indicated by section lines 4—4 in FIG. 2, and including a prior art crystal mass-sensor in a deposition zone.

Turning to FIG. 4, a schematic cross sectional view of the LEL vapor deposition station 140 is shown, taken along the section lines 4—4 of FIG. 2. A housing 140H defines a chamber 140C. A structure 11 is held in a holder 141 which can be constructed as a mask frame. The mask frame can support a pattern mask in an oriented relationship with respect to features on the structure so that a pattern of an organic light-emitting layer can be formed, as may be desired in a multicolor organic light-emitting device. The structure depicted here includes the substrate 11, the first electrodes 12, and the organic hole-transporting layer 13 of the device of FIG. 1, layer 13 having been provided in station 130 of FIG. 2. A source 144 is positioned on a thermally insulative support 142, the source 144 filled with a supply of organic light-emitting material 14a to a level 14b. The source 144 is heated by heating elements 145 which are connected via leads 245 and 247 to corresponding output terminals 244 and 246 of a source power supply 240.

When a source temperature is sufficiently elevated, the organic light-emitting material 14a will evaporate or sublime and thus provide a deposition zone 14v of vapor of organic light-emitting material, indicated schematically by dashed lines and arrows.

The structure 11 as well as a conventional crystal mass-sensor 200 are positioned within the deposition zone, and each of these elements has an organic light-emitting layer being formed thereon as indicated by the designation 14f, shown in dashed outline.

As is well-known in the art, the crystal mass-sensor 200 is connected via a lead 210 to an input terminal 216 of a deposition rate monitor 220. The sensor 200 is part of an oscillator circuit provided in the monitor 220 and the circuit oscillates at a frequency which is approximately inversely proportional to a mass-loading of the crystal such as by a mass-loading provided by the layer 14f being formed. The monitor 220 includes a differentiating circuit which generates a signal proportional to a rate of mass-loading, i.e. proportional to a rate of deposition of the layer 14f. This signal is indicated by the deposition rate monitor 220, and is provided at an output terminal 222 thereof. A lead 224 connects this signal to an input terminal 226 of a controller or amplifier 230 which provides an output signal at an output terminal 232. The latter output signal becomes an input signal to the source power supply 240 via lead 234 and input terminal 236.

Thus, if the vapor stream within the vapor deposition zone 14v is temporally stable, the mass build-up or growth of the layer 14f will proceed at a constant rate. The rate monitor 220 will provide a constant signal at output terminal 222, and the source power supply 240 will provide a constant current to the heating elements 145 of the source 144 via the leads 245 and 247, thereby maintaining the temporally stable vapor stream within the deposition zone. Under stable vapor deposition conditions, i.e. conditions of a constant deposition rate, a desired final thickness of an organic light-emitting layer 14 (see FIG. 1) is achieved on the structure and on the crystal mass-sensor 200 during a fixed deposition duration, at which time the vapor deposition is terminated by terminating the heating of the source 144, or by positioning a shutter (not shown) over the source.

While a relatively simple source 144 is shown in FIG. 4 for illustrative purposes, it will be appreciated that numerous other source configurations can be effectively used to provide evaporated or sublimed vapors of organic materials within a deposition zone. Particularly useful sources are extended or linear physical vapor deposition sources disclosed by R. G. Spahn in U.S. patent application Ser. No. 09/518,600, filed Mar. 3, 2000, and commonly assigned.

Figure 5:
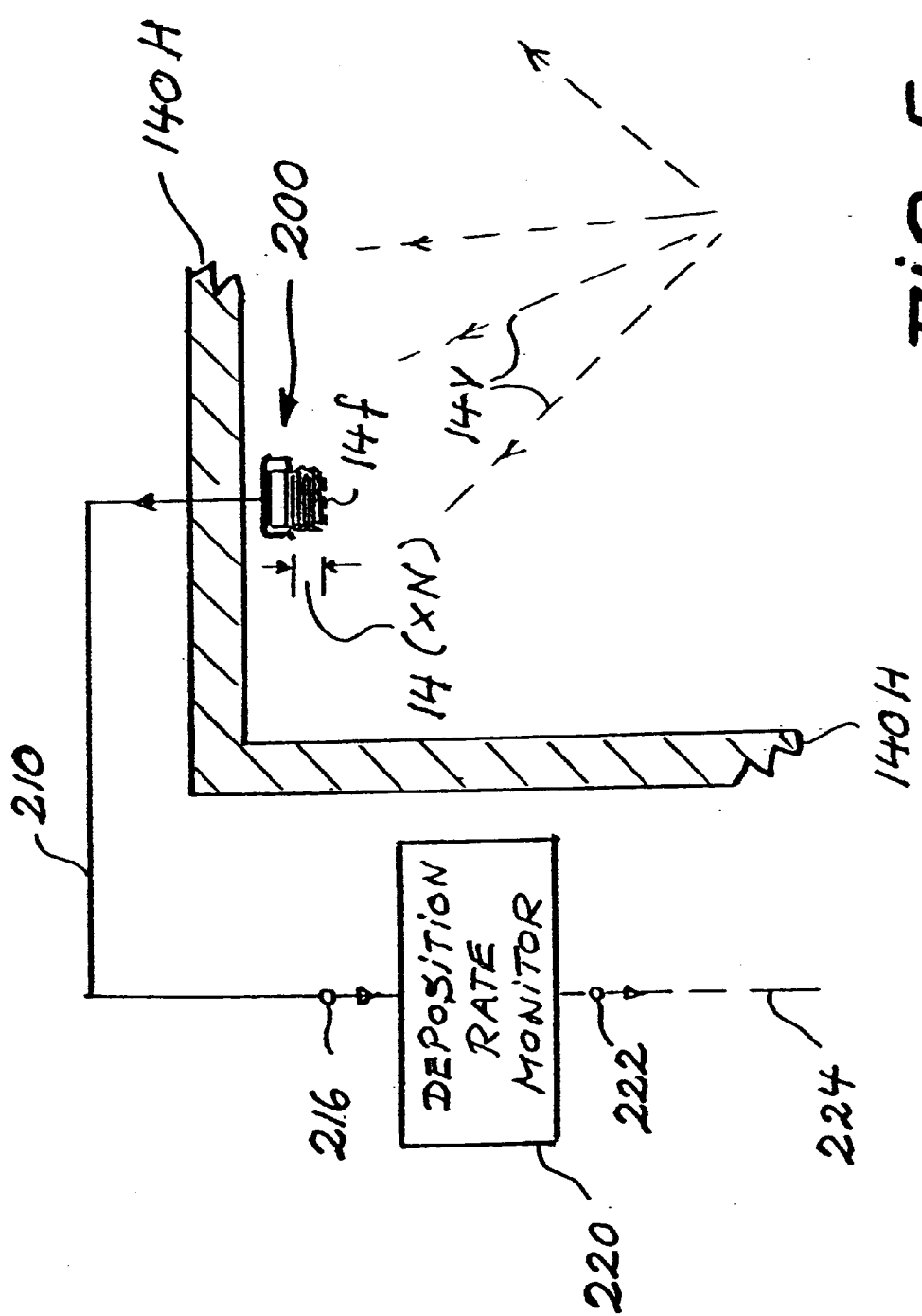
FIG. 5 shows schematically the sensor of FIG. 4 having formed on one surface a relatively high mass-loading in the form of a number N of layers of organic light-emitting material wherein such mass-loading of a prior art sensor would cause the associated deposition rate monitor to become unreliable in its reading of deposition rate, or to become inoperative.

FIG. 5 shows schematically the crystal mass-sensor 200 of FIG. 4 now having a relatively high mass-loading in the form of a number N of layers of organic light-emitting material 14. At such relatively high mass-loading (due to cumulative deposition of layers as N substrates or structures in succession received an organic light-emitting layer 14) the deposition rate monitor 220 may become inoperative or become unreliable in its reading of a deposition rate. The monitor 220 may also become unreliable due to cracking, peeling or flaking of portions of the organic material deposited on the sensor at thicknesses lower than a thickness corresponding to N successive layers.

Figure 6:
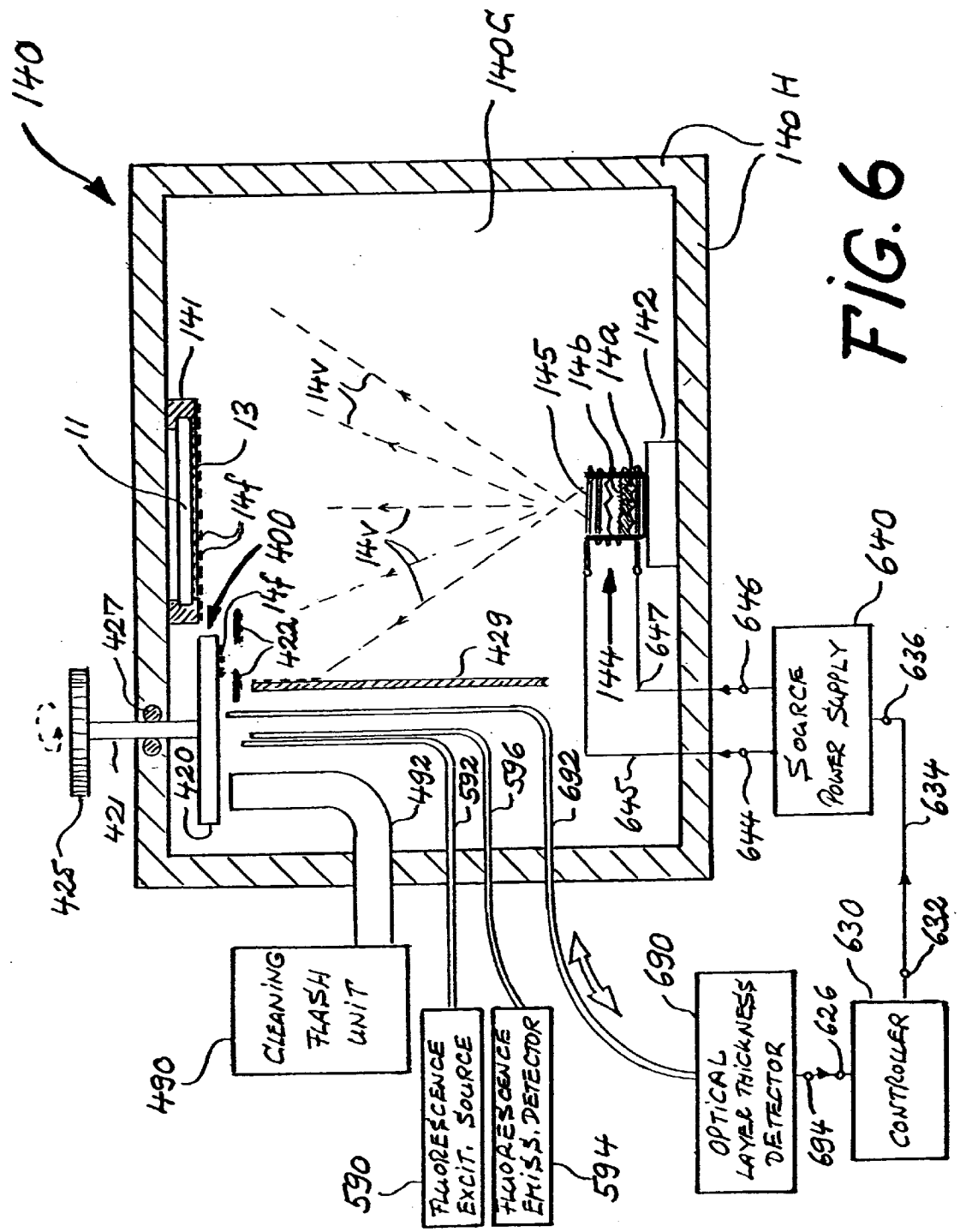
FIG. 6 shows schematically, positioned within the LEL deposition station of FIG. 2, a rotatable disc assembly in accordance with one embodiment of the invention in which a portion of a disc receives organic light-emitting material in a deposition zone, the disc then being rotated outside the deposition zone in sequence to move the portion into one or more optical sensing positions and into a cleaning position prior to returning into the deposition zone.

Turning to FIG. 6, the vapor deposition station 140 of FIG. 2 is shown in a sectional view, including the housing 140H which defines the chamber 140C. The source 144, the vapor deposition zone 14v of vapor of organic light-emitting material, and the structure 11 held in the holder or frame mask 141 correspond to like parts of the station 140 of FIG. 4.

A rotatably movable disc assembly 400 includes a disc 420, a shaft 421 attached to the disc and rotatably disposed in the housing 140H via a seal 427, and a rotator 425 attached to the shaft 421 for rotating the disc 420 through each of several positions of rotation. The rotator 425 is depicted here as a manual rotator for illustrative purposes only. It will be appreciated that the rotator 425 can be, for example, an indexed stepper motor.

The disc 420 extends into the deposition zone 14v of vapor of organic light-emitting material. A shield 429 shields other portions of the disc and optical sensing and optical cleaning members disposed along such other portions from the deposition zone 14v. A shutter 422, depicted in an open position, allows a layer 14f to be formed on a portion of the disc 420 disposed proximate the open shutter 422 at the same time as a layer 14f is being formed on the structure 11, i.e. over the organic hole-transporting layer 13 which had been vapor deposited previously on the substrate 11 and first electrodes 12 (see FIG. 1) in a station 130 (HTL) of FIG. 2. The shutter 422 is shown here and in FIGS. 7A–7B, 8,9, and 10 as having two elements (not identified individually, for purposes of clarity of these drawings). It will be appreciated that various other shutters can be designed for the effective use in conjunction with the inventive apparatus.

The disc 420 is constructed of a thermally and structurally stable material. Preferred materials include glass, quartz, ceramic, silicon, and metal.

Optical sensing elements, as well as an optical cleaning means for removing in whole or in part organic material from the disc 420, will now be described in terms of function with respect to the surface of the disc 420 which receives the organic layer, for example the organic light-emitting layer 14f being formed thereon. The positions of such sensing elements and cleaning means along a path of motion of the disc 420 are indicated schematically in the plan views of the disc 420 in dotted outline in FIGS. 7A–7D, together with the layer 14f being formed. The shield 429 has been omitted from FIGS. 7A–7D. The dotted outlines have been chosen to more clearly show the motion of a circular area of the layer 14f.

Figure 7A:
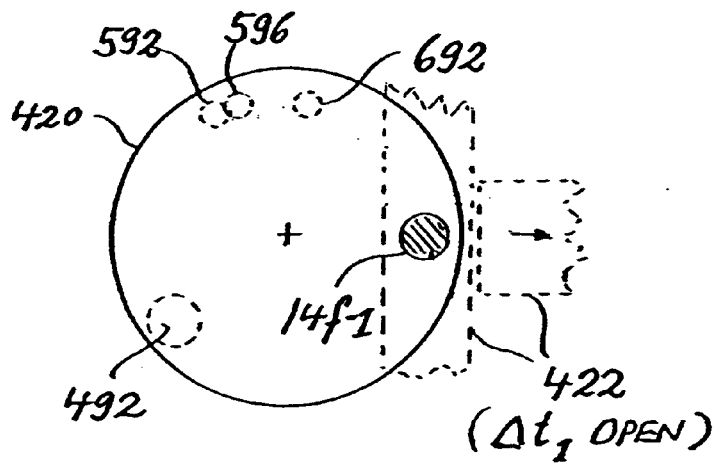
Figure 7B:
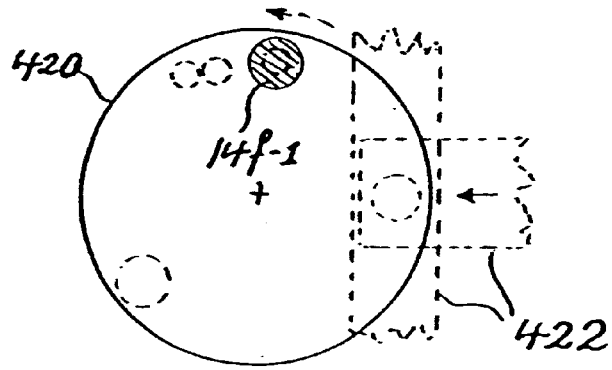

An optical layer thickness detector 690 includes a shutter timing module (not shown) which has an electrical connection (not shown) to the shutter 422 for selecting one or several intervals during which the shutter 422 is electrically actuated into an open position from a normally closed position while the layer 14f is being formed on the structure 11 to a desired final thickness of a light-emitting layer 14 (see FIG. 1). The detector 690 can also include an actuating circuit (not shown) for actuating rotation of the disc 420 if the rotator 425 is an indexed motor or stepper motor (not shown). Rotation of the disc commences following the aforementioned shutter-open interval, and to a position in which an optical fiber conduit 692 directs thickness-measuring illumination (schematically indicated by a portion of an open arrow pointing in a direction towards the disc 420) from the detector 690 onto the layer 14f which is now rotated into a position outside the deposition zone 14v. The optical layer thickness detector 690 receives from the layer 14f a reflected fraction (schematically indicated by a portion of the open arrow pointing in a direction towards the detector 690) of the measuring illumination which can be calibrated to correspond to a thickness of the layer 14f achieved during a shutter-open interval. For example, if the shutter 422 is open for an interval $\Delta t_1$, a layer 14f-1 is deposited on the disc 420 (see FIG. 7A). The layer thickness determination position of the layer 14f-1 is shown in FIG. 7B with the designation 692, corresponding to the optical fiber conduit 692 of FIG. 6.

The optical layer thickness detector 690 includes a computing circuit (not shown) which computes a deposition rate from the optically measured thickness of the layer 14f-1 of organic light-emitting material formed on the disc 420 during the interval $\Delta t_1$ of the open condition of the shutter 422. This computed deposition rate is provided as a signal at an output terminal 694 of the detector 690, and is provided to an input terminal 626 of a controller or amplifier 630 to provide at an output terminal 632 thereof a control signal which is applied to an input terminal 636 of a source power supply 640 via a lead 634. The source power supply, in turn, provides current to the heating elements 145 of the source 144 via output terminals 644 and 646 and corresponding leads 645 and 647, respectively, so that the vapor flux in the deposition zone defined by the dashed lines 14v is controlled in correspondence with the computed deposition rate provided by the optical layer thickness detector 690.

The optical layer thickness detector 690 can be constructed as an interferometer which permits selection of a wavelength or of a spectrum of wavelengths of the thickness-measuring illumination. Alternatively, the optical layer thickness detector 690 can be constructed as a spectrophotometer which is operative in a reflectance mode.

Figure 7C:
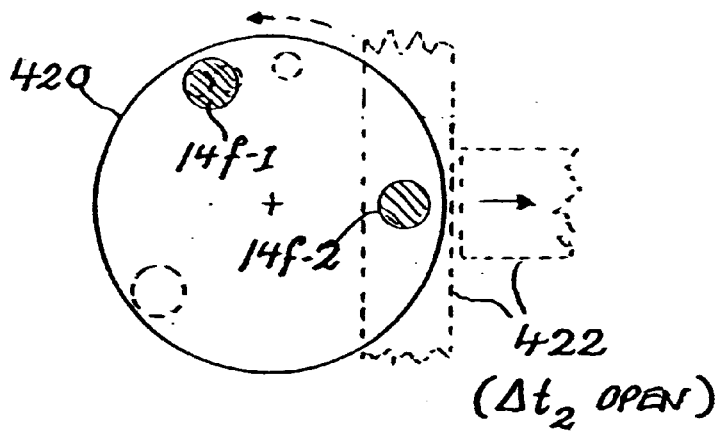

The disc 420 is then rotated into a third position so that the layer 14f-1 is substantially positioned over a pair of optical fiber conduits 592, and 596. At the same time, the shutter 422 can be activated again to be in an open position for a timed interval $\Delta t_2$, as indicated in FIG. 7C, to provide a vapor deposited layer 14f-2 on a different portion of the disc 420, wherein $\Delta t_2$ can be a shorter or a longer selected time interval than $\Delta t_1$.

It is well-known to those skilled in the art of fabricating organic light-emitting devices that numerous organic light-emitting materials of a class of metal chelates (such as, for example, aluminum chelate materials) are capable of luminescence or fluorescence upon excitation by light of a suitably selected excitation wavelength. For example, if a partially formed organic light-emitting layer 14f-1 (or 14f-2) is illuminated by "activating radiation" of near-ultraviolet light or of blue light, such layer may emit fluorescent light in a blue-green spectral region. If such a layer further includes a molecularly dispersed organic dopant, the hue or color of emitted light can be shifted to a longer wavelength range, for example to emission of orange or red light upon fluorescence excitation.

Typically, a dopant concentration in a range from 0.2–2.0 mole percent of a light-emitting organic host material is effective in not only shifting the hue or color of emitted light but to provide optimized luminance of the hue-shifted emitted light.

When a single source is used for vapor-depositing a doped organic light-emitting layer onto a structure, such as the single source 144 of FIG. 6, the organic light-emitting material 14a in the source preferably includes a predoped organic light-emitting material such as disclosed by J. Shi in U.S. patent application Ser. No. 09/574,949, filed May 19, 2000 and commonly assigned.

Vapor deposition of a doped organic light-emitting layer onto a structure by co-deposition from a controlled source containing light-emitting organic host material and from another controlled source containing organic dopant material will be described with reference to FIG. 17.

To provide at least a qualitative measure of an efficacy of luminescence or of fluorescence of a partially formed organic light-emitting layer (such as layers 14f-1 and 14f-2, or in general the layer 14f being formed), a fluorescence excitation source 590 directs fluorescence-exciting light via an optical fiber conduit 592 toward and onto the organic light -emitting layer 14f-1 in the position of the disc 420 indicated in FIG. 7C.

A second optical fiber conduit 596 receives from the layer 14f-1 (or 14f-2) light emitted as luminescent or as fluorescent light and provides such emitted light to a fluorescence emission detector 594 which may include a photomultiplier or semiconductor light detector with suitable optical filters, a scanning spectrometer paired with a suitable light detector, or a spectrograph with either linear or areal CCD or CMOS electronic detectors to characterize the emitted light. Alternatively, a bifurgated fiber optical bundle may be used to direct fluorescence-exciting light to and fluorescence emission from the organic light-emitting layer. For the case shown in FIG. 6, the fluorescence emission is detected in a reflectance mode, that is the excitation light path and the emission light path are oppositely directed. When the disc 420 is constructed from a material that is transmissive to UV and visible light, the second optical fiber conduit can be positioned on the opposite side of the disc from the excitation path and the detection of the fluorescence emission is performed in a so-called transmission mode. It is well known to those skilled in the art that other geometric arrangements of the excitation and emission light paths are possible and may provide advantages in their use under certain conditions.

Fluorescence or luminescence signals may be used to provide more than a qualitative measure of an efficacy of a particular thin film's ability to emit light. Methods have been disclosed that allow the thickness of various thin film layers to be measured using the intensity of the fluorescence emission signal (see EP 1036828 A1 and references contained therein, or De Freitas et al., Proc. SPIE-Int Soc. Opt. Eng. (2000), 4076, p. 152–161).

The fluorescence excitation source 590 and the fluorescence emission detector 594 can be incorporated in a single instrument, referred to as a spectrofluorimeter.

Figure 7D:
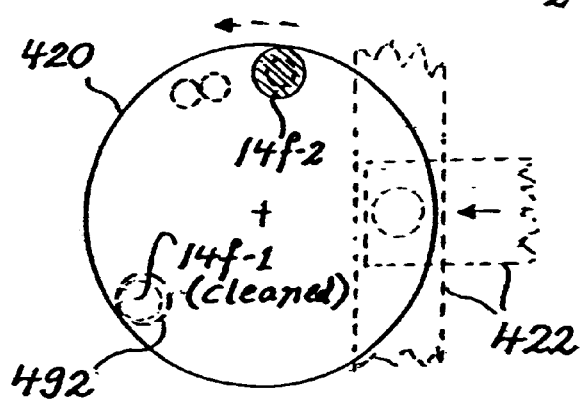

The disc 420 is then rotated into a cleaning position in which the layer 14f-1 (or 14f-2) is removed from the disc in whole or in part by directing a suitably intense flash of radiation towards the layer(s) from a cleaning flash unit 490 via a light guide 492, as schematically indicated in FIG. 7D. Such cleaning or removal of organic material form the disc 420 is effected by sublimation or by evaporation in a manner substantially equivalent to formation of the organic vapors in the vapor deposition zone 14v by sublimation or by evaporation of organic material form the source 144. Thus, removal of organic material from the disc provides a reusable disc.

It will be appreciated that the light guide 492 is coupled through the housing 140H via a vacuum-sealed feed-through (not shown). Similarly, all electrical leads enter or exit the chamber 140C through the housing 140H via a corresponding electrical feed-through. Such feed-through elements are well-known in the art of vacuum system technology.

The light guide 492 can be an optical fiber cable constructed of a material which transmits light provided by the cleaning flash unit 490. Alternatively, the light guide 492 can be constructed as a hollow or tubular light-transmissive element.

The sequences of vapor deposition of organic light-emitting material, such as partial layers 14f-1 and 14f-2, and of subsequent partial layers, layer thickness measurement and computation of a deposition rate with associated control of the source power supply 640, determination of a fluorescence or a luminescence efficacy of an organic layer, and the partial or complete removal of organic material from the disc 420, are repeated as frequently as may be desired during the vapor deposition of an organic light-emitting layer on the structure 11 until such layer 14 (see FIG. 1) has reached a final thickness. The vapor deposition is then discontinued by, for example, closing a shutter (not shown) positioned above the source 144, and is resumed once a new structure has been positioned in the chamber 140C, following removal of a completed structure.

A final thickness of an organic layer, for example of an organic light-emitting layer 14 (see FIG. 1) has a layer thickness in a preferred range from 20 to 200 nm. In order to provide a uniform organic layer by physical vapor deposition (i.e. a layer without so-called dark defects or bright defects which would be readily observable in an operative device), a deposition rate in a preferred range from 1 to 10 nm per second is desirable. Thus, if a final layer thickness of an organic light-emitting layer 14 is selected to be 100 nm, such thickness can be achieved in 40 seconds by evaporation or by sublimation at a controlled constant deposition rate of 2.5 nm/sec. During the 40 second deposition time, the disc 420 may receive several organic deposits and be rotated through respective optical sensing positions and the cleaning position several times so that vapor deposition from the source 144 can be controlled or adjusted several times during the formation of an organic layer to a final selected thickness on a structure.

Figure 6A:
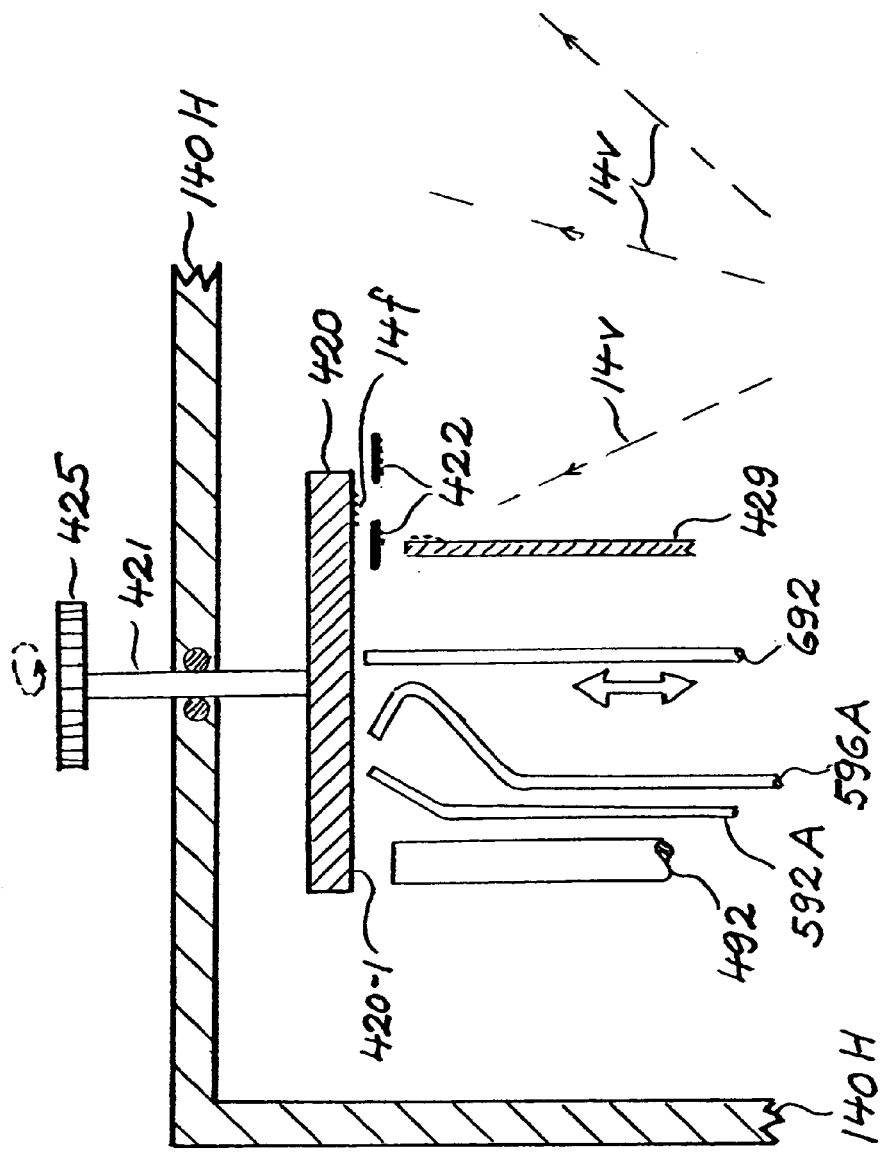

FIG. 6A is a partial sectional view of the housing 140H of FIG. 6. The disc 420 is shown as an optically opaque disc such as, for example, a ceramic disc, a metal disc, or a silicon-wafer disc. A first surface 420-1 (front surface) is preferably a polished, optically reflective surface to provide reliable optical layer thickness detection and reliable fluorescence efficacy measurement of the organic light-emitting layer 14f being formed on this first surface.

The optical fiber conduit 592A is shown with an angled upper portion to direct fluorescence-exciting light at the layer 14f (when rotated into the fluorescence-measuring position—see FIG. 7C) under an oblique angle with respect to the disc surface 420-1. Similarly, the optical fiber conduit 596A is shown with an angled upper portion to receive fluorescent light emitted from the layer 14f. Preferably, the angled upper portions of the optical fiber conduits 592A and 596A form a right angle.

The light guide 492, the optical fiber conduit 692, and the shutter 422 have been described with reference to FIG. 6.

FIG. 6B is a partial sectional view of the housing 140H of FIG. 6. Here, the disc 420 is depicted as an optically transmissive disc such as, for example, a glass disc or a quartz disc. The optical transparency of such disc allows for optical layer thickness detection in a transmissive mode by directing thickness-measuring illumination from the optical layer thickness detector 690 towards the first disc surface 420-1 via an input optical fiber conduit 692-1. A fraction of this illumination, related to absorption in, or scattering by the organic layer 14f, is transmitted through the disc to the second disc surface 420-2 and is coupled into an output optical fiber conduit 692-2 for transmission to the thickness detector 690.

The optical layer thickness detector is calibrated to provide accurate thickness values over a selected range of thicknesses of organic layers being formed on the disc (and on the structure 11 of FIG. 6). Such calibration is performed for an instrument designated for measuring thicknesses of organic deposits on a reflective disc, and for an instrument designated for measuring thicknesses of organic deposits on a transmissive disc. Each of such instruments provides output signals which can be processed to correspond to a measured deposition rate of organic material on the disc 420, and which are used to control evaporation or sublimation of organic material from the source 144 via the controller 630 which controls the source power supply 640 (see FIG. 6).

Figure 8:
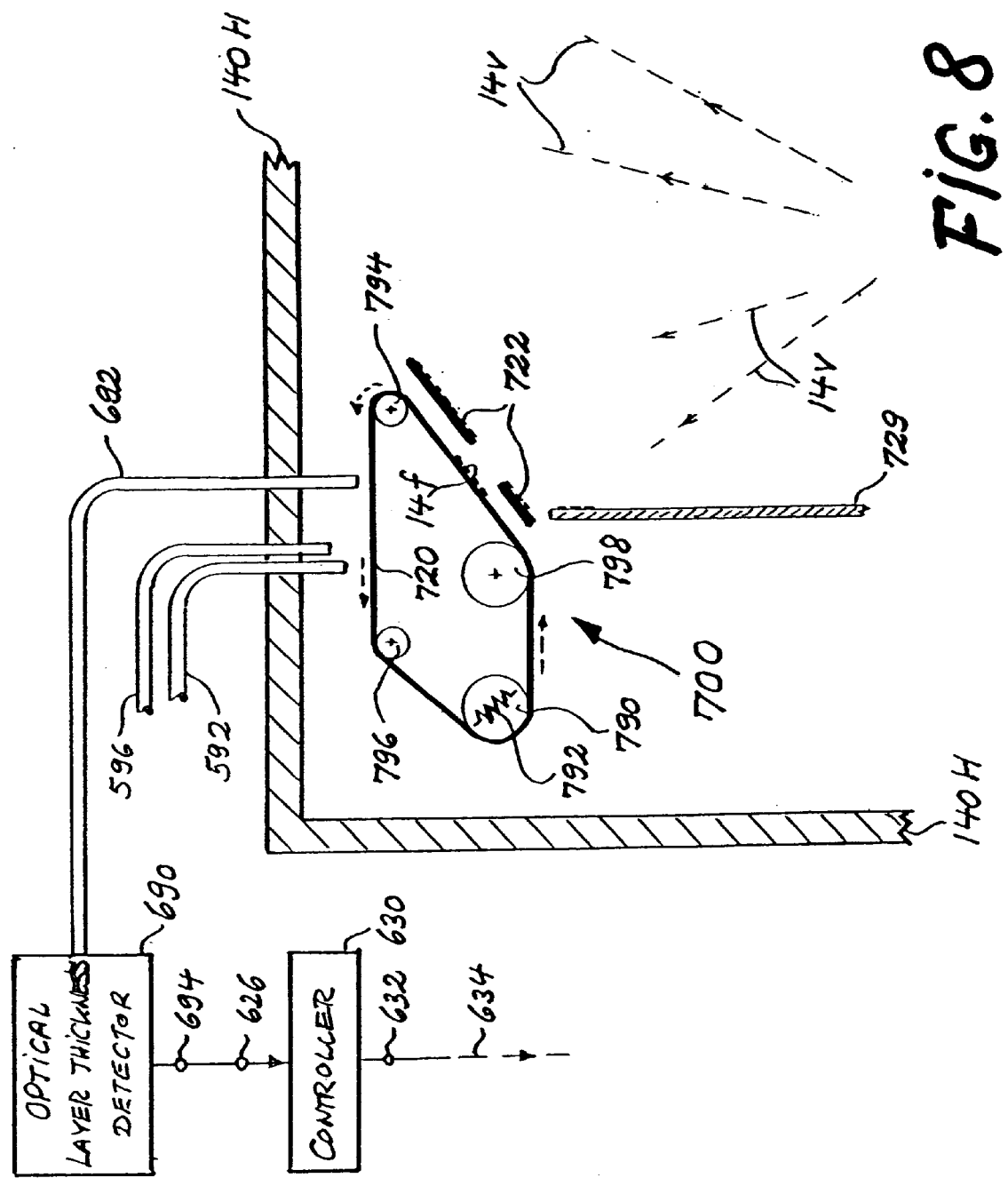
FIG. 8 is a partial sectional view of the housing of FIG. 6 in which the disc assembly has been replaced by a belt assembly in accordance with a second embodiment of the invention, in which the removal of organic material from a belt is provided by a heated roller and the belt is cooled by a chill roller prior to advance into the deposition zone.

Turning to FIG. 8, a partial sectional view of the housing 140H of the station 140 of FIG. 6 is shown in which the disc assembly 400 has been replaced by a belt assembly 700 in a second embodiment of a reusable assembly, in accordance with the present invention.

The vapor deposition zone 14v, optical fiber conduit 692 and associated optical layer thickness detector 690 and controller 630, and optical fiber conduits 592 and 596 correspond to like parts of FIG. 6 and provide previously described functions. The shield 729 and the shutter 722 correspond in purpose and function to shield 429 and shutter 422 of FIG. 6. Therefore, such corresponding parts or functions do not required detailed description with reference to FIG. 8.

The belt assembly 700 includes a continuous belt 720 which is preferably constructed of a metal such as, for example, a foil of stainless steel. The belt 720 is translated by actuating a motor or stepper motor (not shown) coupled to a belt driver roller 794. Such motor or stepper motor is actuated via electrical connection (not shown) to an actuating circuit (not shown) contained within the optical layer thickness detector 690, which may also have a shutter timing module for selectably actuating the shutter 722 into the open position depicted here from a normally closed position, as described previously with reference to FIG. 6.

The belt assembly 700 further includes an idle roller 796, a heated cleaning roller 790 having a heater 792, and a chill roller 798. The heated cleaning roller 790 and the chill roller 798 are in contact with a surface of the belt 720 which is opposite a belt surface on which a partial layer 14f of organic light-emitting material is being formed during a timed shutter-open interval of shutter 722.

The belt assembly 700 provides a function which is substantially equivalent to the function of the disc assembly 400 of FIG. 6. Following vapor deposition of a partial organic light-emitting layer 14f on the belt 720 during a timed open interval of the shutter 722, this deposit is sequentially positioned with respect to the optical fiber conduits 692, and 596 and 592 for optical sensing of layer thickness and determination of an efficacy of fluorescence emission, respectively. Such sequential positioning is achieved by translating the belt 720 via the belt drive roller 794. The layer 14f on the belt is then advanced past the heated cleaning roller 790 for removal in whole or in part of the organic layer 14f from the belt by sublimation or evaporation induced by heat from the roller 790. A thus cleaned portion of the belt is advanced past the chill roller 798 which facilitates cooling of the previously heated portion to a desired temperature prior to advancing this belt portion into the deposition zone for receiving another timed vapor deposited layer 14f.

Figure 9:
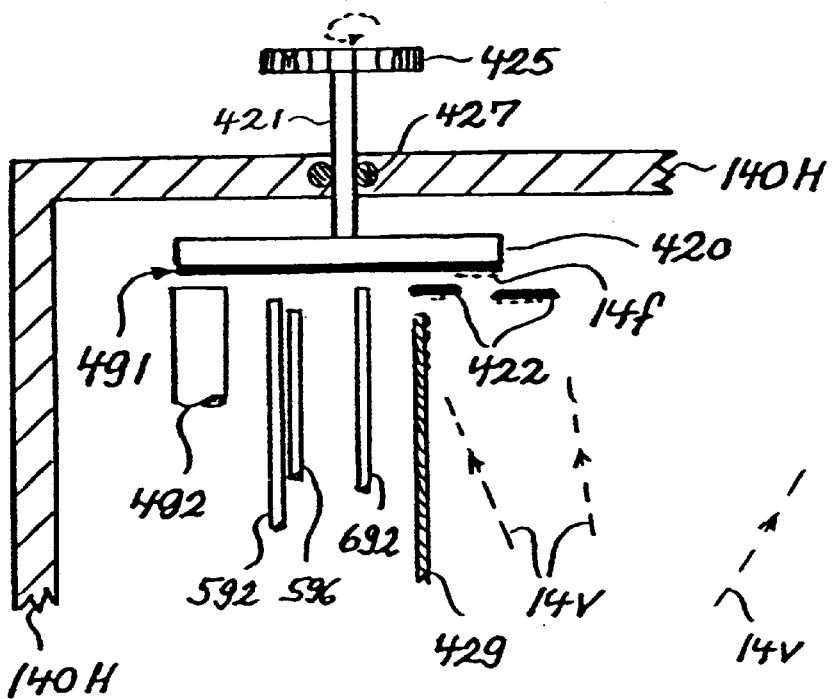
FIG. 9 is a partial sectional view of the housing of FIG. 6 in which the rotatable disc has a radiation-absorbing layer preformed on a disc surface in accordance with the present invention for enhancing removal of organic material by a flash of radiation.

Turning to FIG. 9, the disc assembly of FIG. 6 is shown in which the disc 420 includes a preformed radiation-absorbing layer 491. The radiation-absorbing layer 491 can be a layer of radiation-absorbing carbon or other radiation-absorbing material for enhancing removal in whole or in part of an organic layer, such as a layer 14f, from the disc by a radiation flash directed at the organic layer in the cleaning position via the light guide 492.

Figure 10:
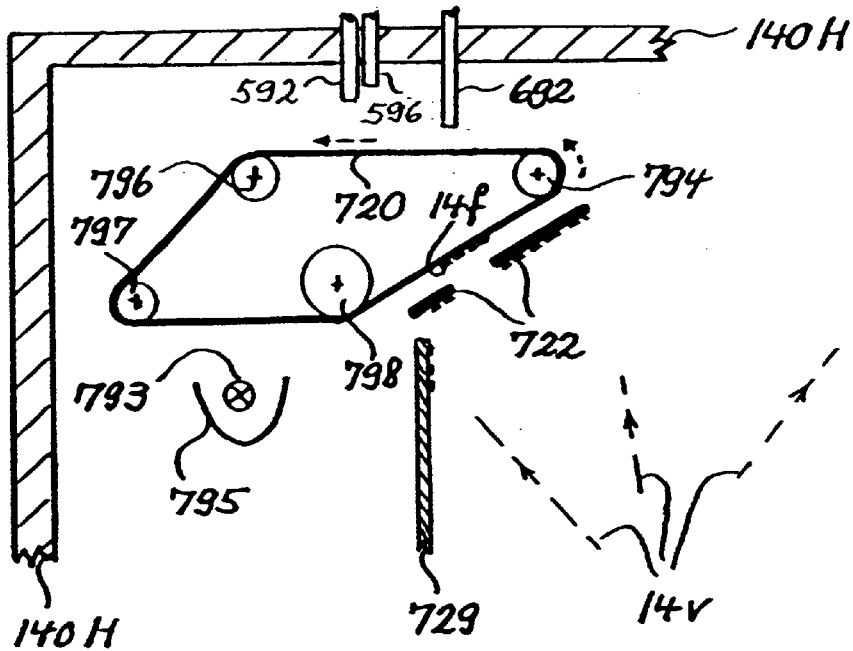
FIG. 10 is a partial sectional view of the housing of FIG. 6 in which the removal of organic material from the belt is provided by a heating lamp in accordance with the invention.

Turning to FIG. 10, the heated cleaning roller 790 of the belt assembly 700 of FIG. 8 is replaced by an idle roller 797, and partial or complete removal of an organic layer, such as a partially formed organic light-emitting layer 14f, from the belt 720, is provided by a heating lamp 793 which directs heat-radiation towards the belt via a reflector 795. The heating lamp 793 can be a well-known quartz heating lamp which is actuated by applying electrical power to the lamp form a lamp power supply (not shown) disposed outside the housing 140H of the station 140.

Turning to FIG. 11, a partial sectional view of the housing 140H of the station 140 of FIG. 6 is shown in which the disc assembly 400 of FIG. 6 has been replaced by a rotating disc assembly 400r. The disc assembly 400r includes a continuously rotating disc 420r which is rotating via a motor drive shaft 421M driven by a motor 425M under control of a motor speed controller 425SC. The speed controller 425SC can be adjusted to provide a desired rotational speed of the disc 420r. For example, the speed controller can be adjusted to provide three revolutions per minute (3 rpm) of the disc.

The disc 420r is depicted as an optically opaque disc having a first surface 420-1 which is preferably a polished, reflective surface. It will be understood that the disc 420r can be a transmissive disc made, for example, of glass or quartz such as described with respect to the disc 420 of FIG. 6B. The optical fiber conduits 592A, 596A, and 692 are the same parts described with reference to FIG. 6A.

One distinguishing feature of the configuration of FIG. 11 is a cleaning radiation unit 490R which, when actuated, provides cleaning radiation (shown schematically in dashed outline) at a cleaning position of the disc 420r via a lens or lenses 492L, a radiation-transmissive window 492W in the housing 140H, and a mirror 492M. The cleaning radiation unit 490R is adapted to provide a beam of radiation (for example, a beam from a laser source) via an actuator circuit (not shown) which, in turn, can be enabled in response to a signal from the optical layer thickness detector 690 (see FIG. 6) when a desired thickness of an organic light-emitting layer 14 has been achieved.

Another distinguishing feature of the configuration of FIG. 11 is that continuous rotation of the disc 420r forms a circular band 14f(r) of organic light-emitting material on the disc surface 420-1 (see FIGS. 12A–12C), in contrast to the discrete deposits formed by the timed shutter-open intervals described with reference to FIGS. 7A–7D. This circular band 14f(r) is formed by providing an aperture 429a within a horizontal extension 429h of the shield 429, the aperture 429a positioned in the deposition zone defined by the vapor stream 14v (see FIG. 11).

Figure 12A:
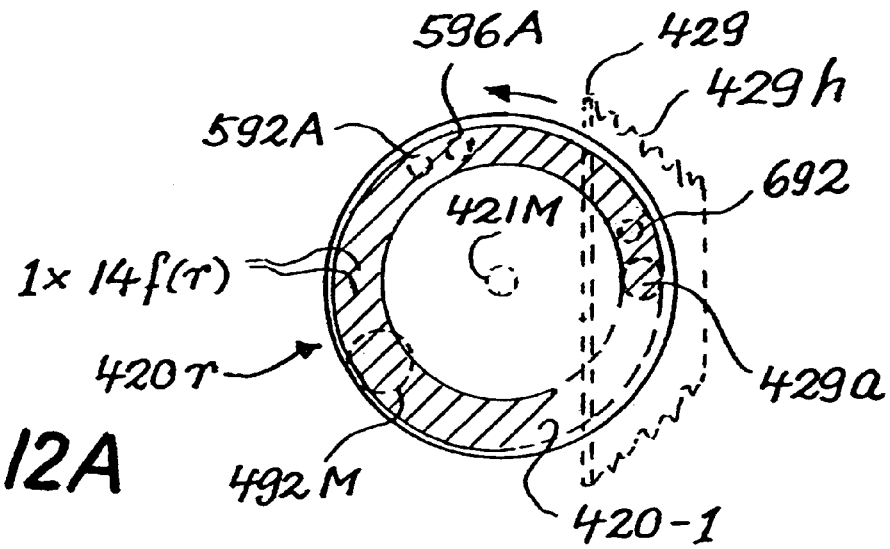
Figure 12B:
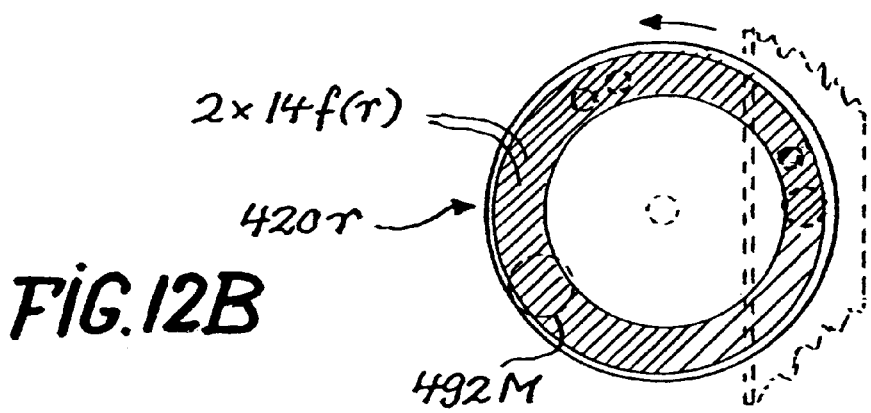
Figure 12C:
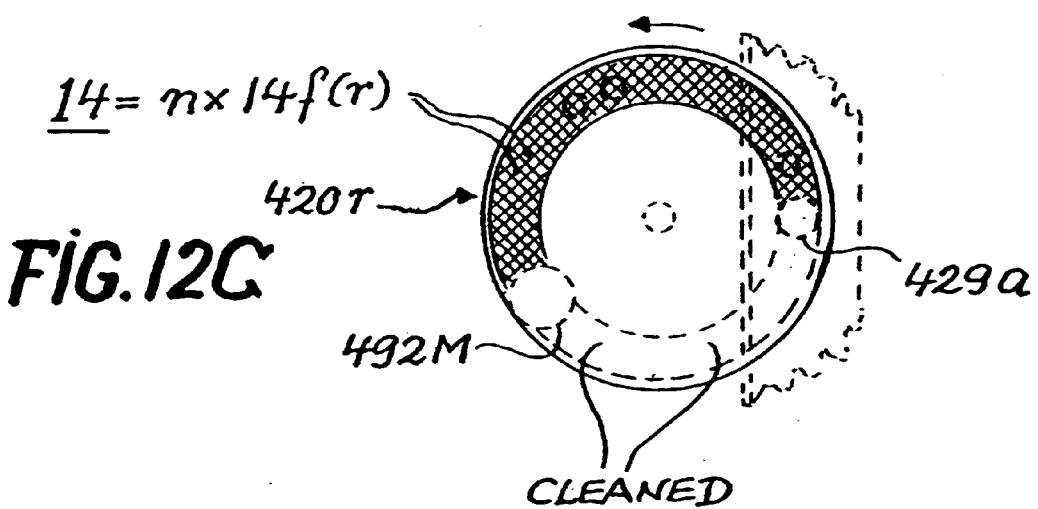

Turning to FIGS. 12A–12C, plan views of the rotating disc 420r are shown. The disc surface 420-1 is being viewed, and dashed outlines are used to indicate the shield, aperture, and optical sensing positions and the cleaning position to provide visual clarity of the drawings.

In FIG. 12A the parts of FIG. 11 are identified, and their relative positions along the rotational motion (indicated by a solid arrow) of the rotating disc 420r are shown with a circular band of deposited organic light-emitting material, designated as "1×14f(r)" in correspondence with one pass of the previously clean disc over the aperture 429a through which the deposit is formed in the deposition zone 14v (see FIG. 11).

Figure 13:
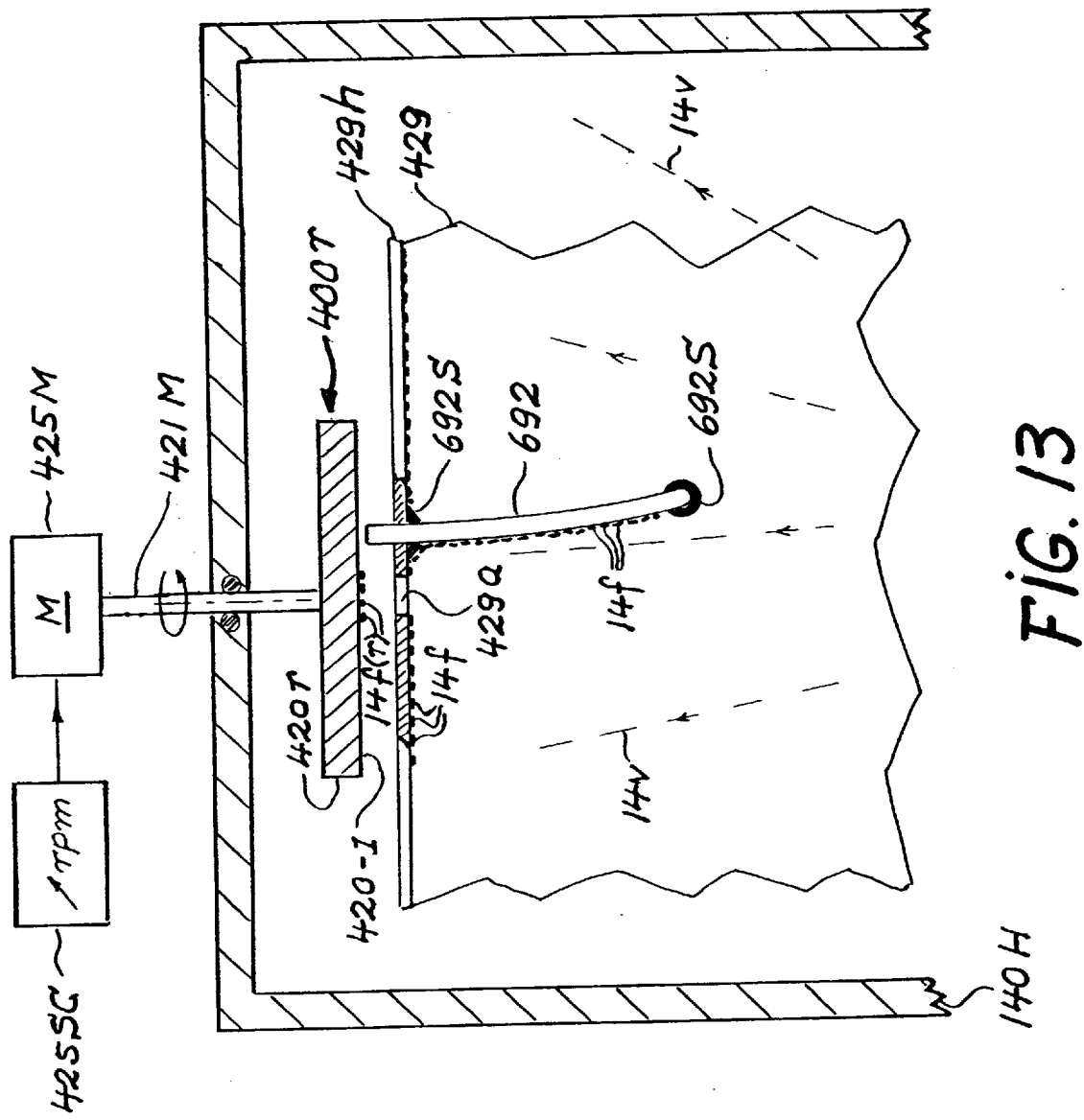
FIG. 13 is a partial sectional view of the housing of FIG. 6 in which the rotating disc assembly of FIG. 11 is viewed under a right angle to show an example of positioning an optical fiber conduit (associated with an optical layer thickness detector) in proximity to an aperture of a shield along a direction of rotation of the rotating disc.

The optical fiber conduit 692 is positioned in proximity to the aperture 429a along the direction of rotation of the disc 420r, as will be detailed in the view of FIG. 13. The optical fiber conduit 692 is coupled to the optical thickness detector 690 (see FIG. 6) which provides monitoring of the thickness of the deposited material 1×14f(r).

Optical fiber conduits 592A and 596A are used for determining an efficacy of fluorescence of the deposited organic light-emitting material, as descried previously with reference to FIGS. 6 and 6A.

A cleaning position (via cleaning radiation from the cleaning radiation unit 490R of FIG. 11) is indicated by the mirror 492M. However, the organic deposit is not being removed from the disc 420r in FIG. 12A.

FIG. 12B depicts the circular band of organic light-emitting material with a darker shading to correspond with a second pass of the disc over the aperture 429a, thereby providing a deposit on the disc 420r which, in the absence of changes in the vapor deposition rate provided by the source 144 (see FIG. 6), has a cumulative thickness twice the thickness of the deposit of FIG. 12A. Accordingly, this organic light-emitting layer being formed is designated as "2×14f(r)" in FIG. 12B.

If the vapor deposition rate has changed measurably (i.e. as measured by the optical layer thickness detector 690 via the optical fiber conduit) in the interval between successive revolutions of the disc 420r, a corresponding change in measured thickness will be compensated by appropriate control of the deposition rate by controlling the source power supply 640 via the controller 630 in response to such change in measured thickness, as described with reference to FIG. 6. Such deposition rate control, if required, can take place relatively rapidly since the thickness-measuring optical fiber conduit 692 is positioned in proximity to the aperture 429a, and signal processing in the detector 690 and controller 630 poses no temporal limitation. It will be appreciated that deposition rate control in response to changing vapor flux from the source 144 will depend on aspects of design of such source which include a feature referred to as "thermal mass".

In FIG. 12C, the circular band of organic light-emitting material is shown with a cross-hatched shading to correspond with n successive passes of the disc over the aperture 429a, where n is a number equal to or greater than 3 in the context of the descriptions of FIGS. 12A and 12B. An organic light-emitting layer 14 is deemed to have been formed by the cumulative thickness of all layers, designated as "n×14f(r)".

Several events take place upon achieving a desired thickness of the layer 14, as measured by the optical thickness detector 690 via the optical fiber conduit 692:

(i) vapor deposition from the source 144 is discontinued. This may occur by closing a shutter (not shown in the drawings) over the source, or by reducing the electrical power provided to the source heating element(s) 145 (see FIG. 6) to a level at which evaporation or sublimation of organic light-emitting material 14a from the source can no longer be sustained;

(ii) the structure 11 of FIG. 6 is removed from the station 140 by a robotic arm (not shown in the drawings) and transported into another station, for example into station 150 of the OLED manufacturing system of FIG. 2;

(iii) removal of the circular band of the organic light-emitting layer 14 proceeds by actuating the cleaning radiation unit 490R to provide cleaning radiation to the rotating disc at the cleaning position indicated by the mirror 492M; and (iv) a new structure 11 is positioned within the station 140 for deposition of an organic light-emitting layer 14 by monitoring and controlling the thickness as described above.

The belt assembly 700 of FIG. 8, and more particularly the configuration shown in FIG. 10, can be adapted to provide a continuously moving belt 720, and the shutter 722 can be replaced by an aperture formed in a portion of the shield 729 to provide an arrangement substantially equivalent in performance to the rotating disc assembly 400r of FIG. 11.

Turning to FIG. 13, a partial sectional view of the housing 140H of FIG. 6 includes the rotating disc assembly 420r of FIG. 11, and the shield 429 is presented in a frontal view to indicate a relatively simple construction which allows a tip portion of the optical fiber conduit 692 to be positioned in proximity to the aperture 429a. The optical fiber conduit 692 enters the shield 429 through a seal 692S (from a location on the far side of the shield, as shown, for example, in FIGS. 6, 6A, and 11). The conduit 692 projects upwardly through another seal 692S in the horizontal extension 429h of the shield 429, so that a sensing tip portion of the conduit 692 is positioned outside the deposition zone of vapors 14v and in proximity to the aperture 429a. Since the optical fiber conduit 692 has a protective outer conduit, deposits 14f being formed over the conduit in the deposition zone do not affect the performance of the optical thickness-monitoring of organic light-emitting deposits 14f(r) being formed on the rotating disc 420r.

Figure 14:
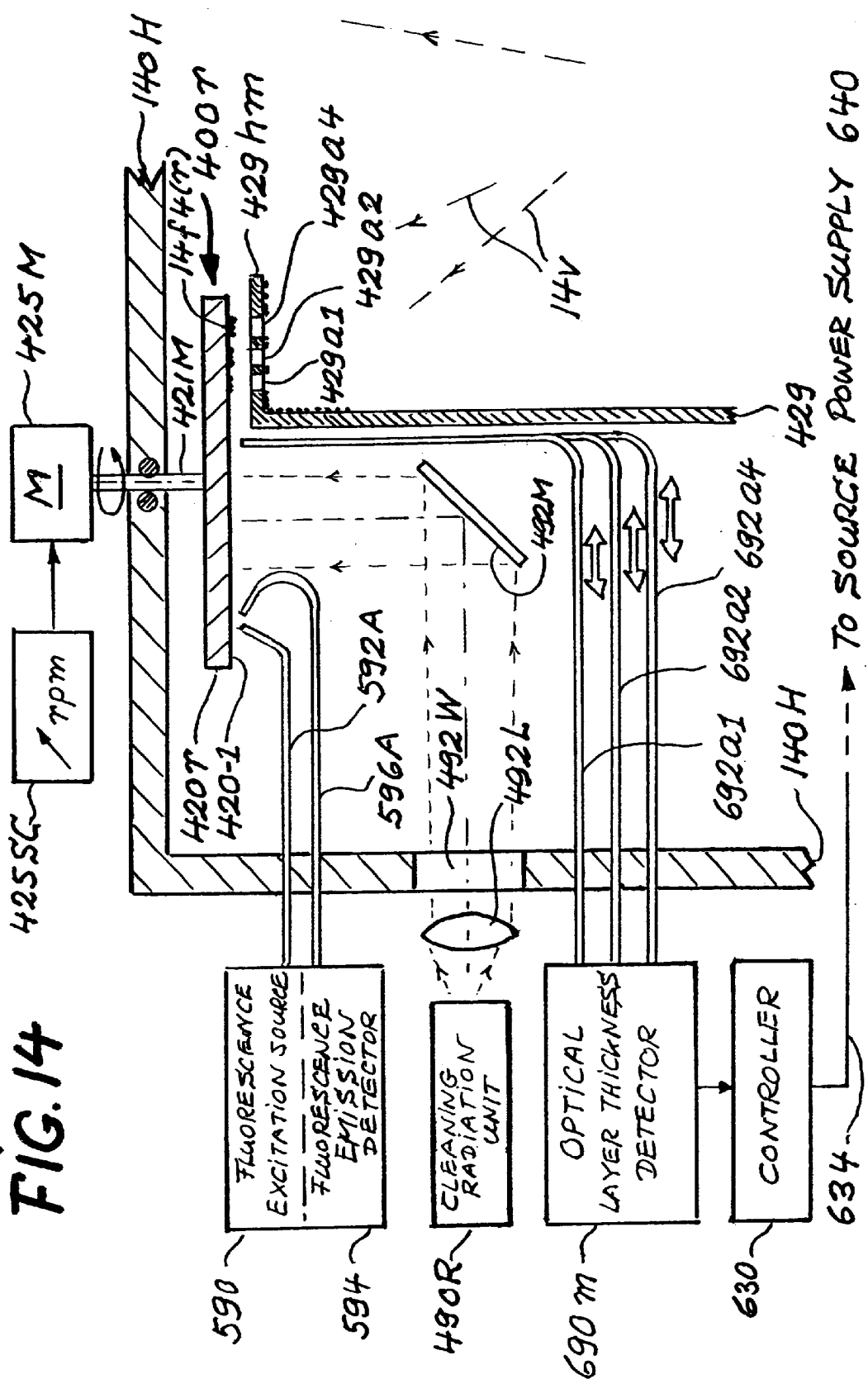
FIG. 14 is a partial sectional view of the housing of FIG. 11 in which multiple apertures in a horizontal portion of a shield provide multiple circular bands of organic light-emitting deposits being formed on the continuously rotating disc, and an optical fiber conduit associated with each circular band for measuring a thickness thereof to provide a vapor deposition rate in a modified optical layer thickness detector, in accordance with an aspect of the present invention.

FIG. 14 is a partial sectional view of the housing 140H shown in FIG. 11. Like numeral designations correspond to like parts or functions. For example, the cleaning radiation unit 490R, the rotating disc assembly 400r, and the angled optical fiber conduits 592A and 596A are identical to like parts described with reference to FIG. 11. Accordingly, only the parts and their functions which differ from previously described drawings are detailed here.

A horizontal portion 429hm of the shield 429 includes multiple spaced-apart apertures 429a1, 429a2, and 429a4 through which vapor of organic light-emitting material passes in the deposition zone defined by the vapor streams 14v. The three apertures are shown for illustrative purposes only. In the practice of this aspect of the invention at least two spaced-apart apertures are required. However, more than three spaced-apart apertures can be used advantageously.

Figure 15:
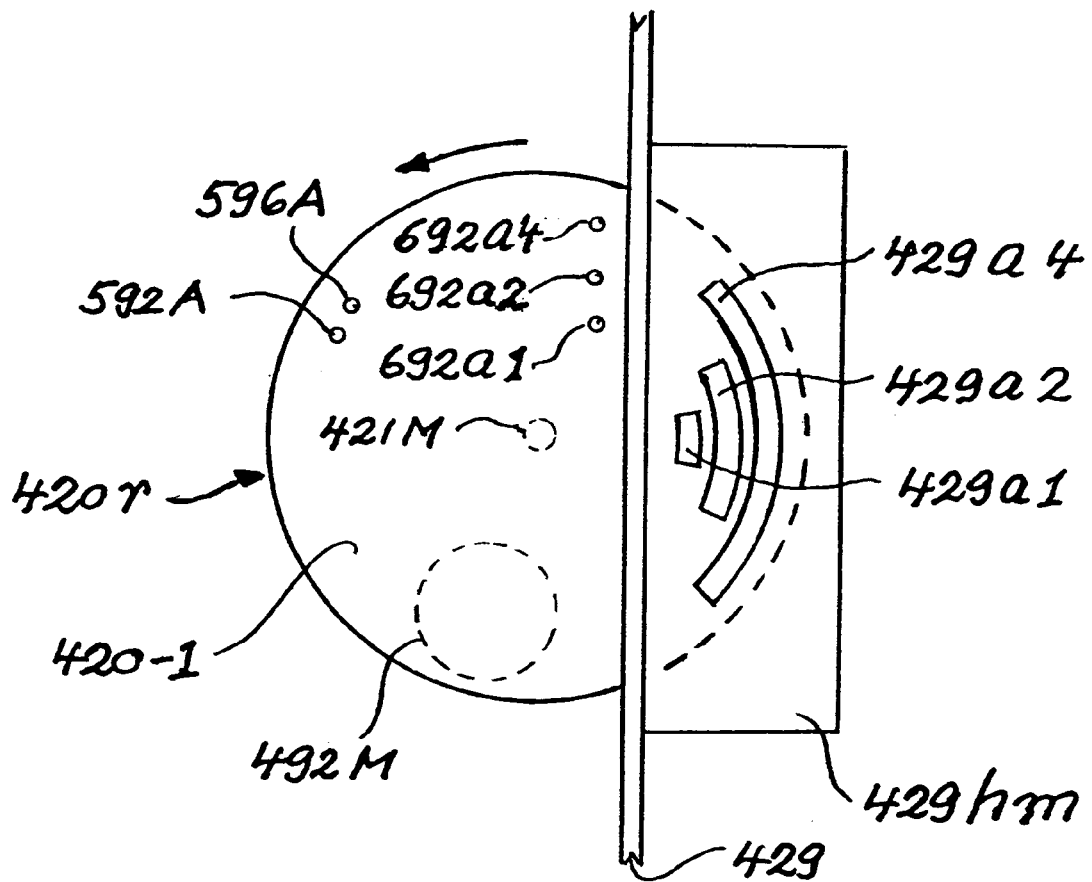
FIG. 15 is a schematic plan view of the rotating disc of FIG. 14 showing multiple apertures in the horizontal shield portion, associated optical fiber conduits, as well as fluorescence measuring positions and a cleaning position.
Figure 16:
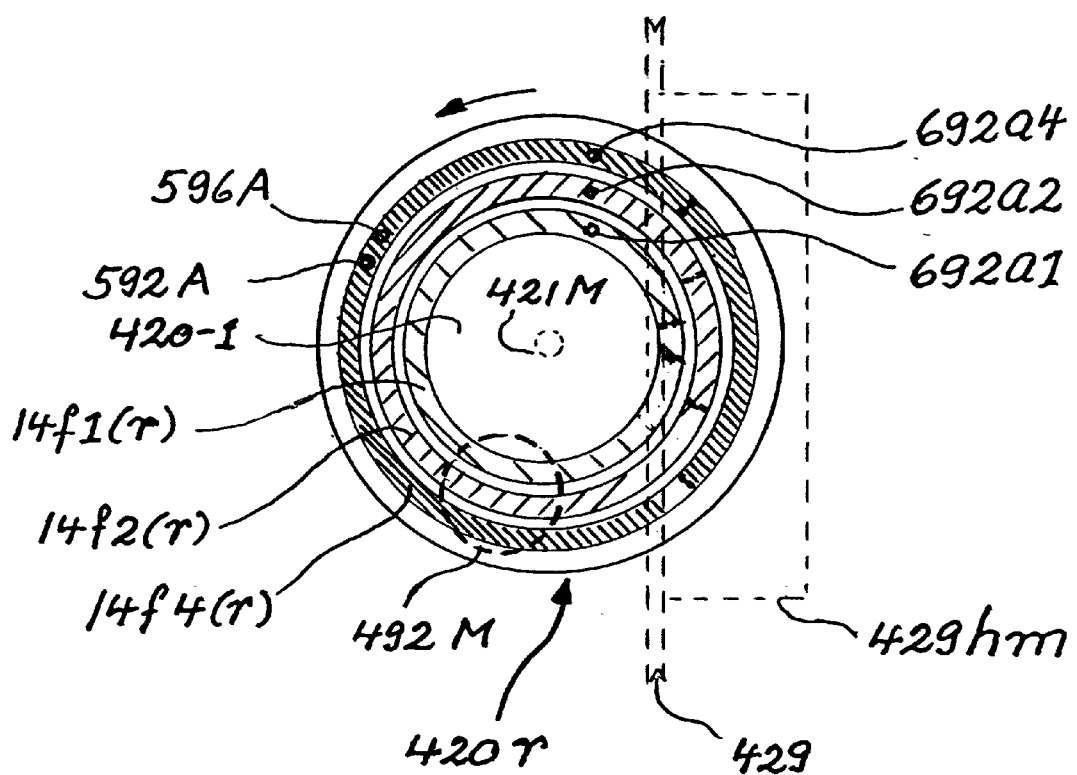
FIG. 16 shows schematically three circular bands of organic light-emitting material vapor-deposited to differing thickness at the same time through the apertures.

The advantage of providing multiple apertures in the horizontal portion 429hm of the shield 429 can be better appreciated by viewing FIG. 15 and FIG. 16 in conjunction with FIG. 14.

FIG. 15 is a schematic plan view of the first disc surface 420-1, together with the shield 429 and its horizontal portion 429hm in which the spaced-apart apertures 429a1, 429a2, and 429a4 are formed so that circular bands of organic light-emitting layers 14f1(r), 14f2(r), and 14f4(r), respectively, are being formed at the same time on the disc surface 420-1 of the rotating disc 420r (see FIG. 16) in correspondence with the apertures. The apertures are configured so that the circular bands of organic light-emitting layers will have fixed ratios of thicknesses with respect to one another for each rotation of the disc 420r past these apertures. For example, the aperture 429a2 is configured to provide an organic light-emitting layer 14f2(r) having twice the thickness of a layer 14f1(r) being formed via the aperture 429a1. Similarly, the aperture 429a4 is configured to provide a circular band of an organic light-emitting layer 14f4(r) having twice the thickness of the layer 14f2(r) being formed via the aperture 429a2, or having four times the thickness of the layer 14f1(r) being formed via the aperture 429a1. Such thickness differences, equivalent to thickness ratios, are indicated schematically by different degrees of shading of the circular bands 14f1(r), 14f2(r), and 14f4(r) in FIG. 16.

It will be appreciated that apertures in the horizontal portion 429hm of the shield 429 can be readily fabricated (for example by laser-beam machining) to provide width dimensions (in a radial direction) in a range of 0.2–0.8 millimeter (mm) and with a spacing in a range of 0.5–1.0 mm.

Within each of the circular bands of the organic light-emitting layers being formed on the disc surface 420-1 is positioned, in a spaced relationship, an optical fiber conduit which provides an optical signal corresponding to a thickness of the respective layers to the optical layer thickness detector 690m. Thus, an optical fiber or fiber conduit 692a1 provides an optical thickness measure of the circular-band layer 14f1(r), an optical fiber or fiber conduit 692a2 provides an optical thickness measure of the layer 14f2(r), and an optical fiber or fiber conduit 692a4 provides an optical thickness measure of the circular-band layer 14f4(r). Since the apertures 429a1, 429a2, and 429a4 have been configured to provide fixed thickness ratios of the layers being formed as circular bands, a comparator circuit (not shown) within the optical layer thickness detector computes a vapor deposition rate directly from the optically measured thicknesses. An output signal from the detector 690 m is proportional to the computed vapor deposition rate, and is used to control the source power supply 640 (see FIG. 6) via the controller or amplifier 630.

The optical fiber conduits 692a1, 692a2, and 692a4 are depicted in FIG. 14 as three individual conduits for illustrative purposes. It is understood that a number of optical fibers can be contained in a fiber cable from which individual optical fibers are separated and suitably positioned with respect to the circular bands on the disc surface 420-1, and the same optical fibers being separated within the layer thickness detector 690m.

Figure 17:
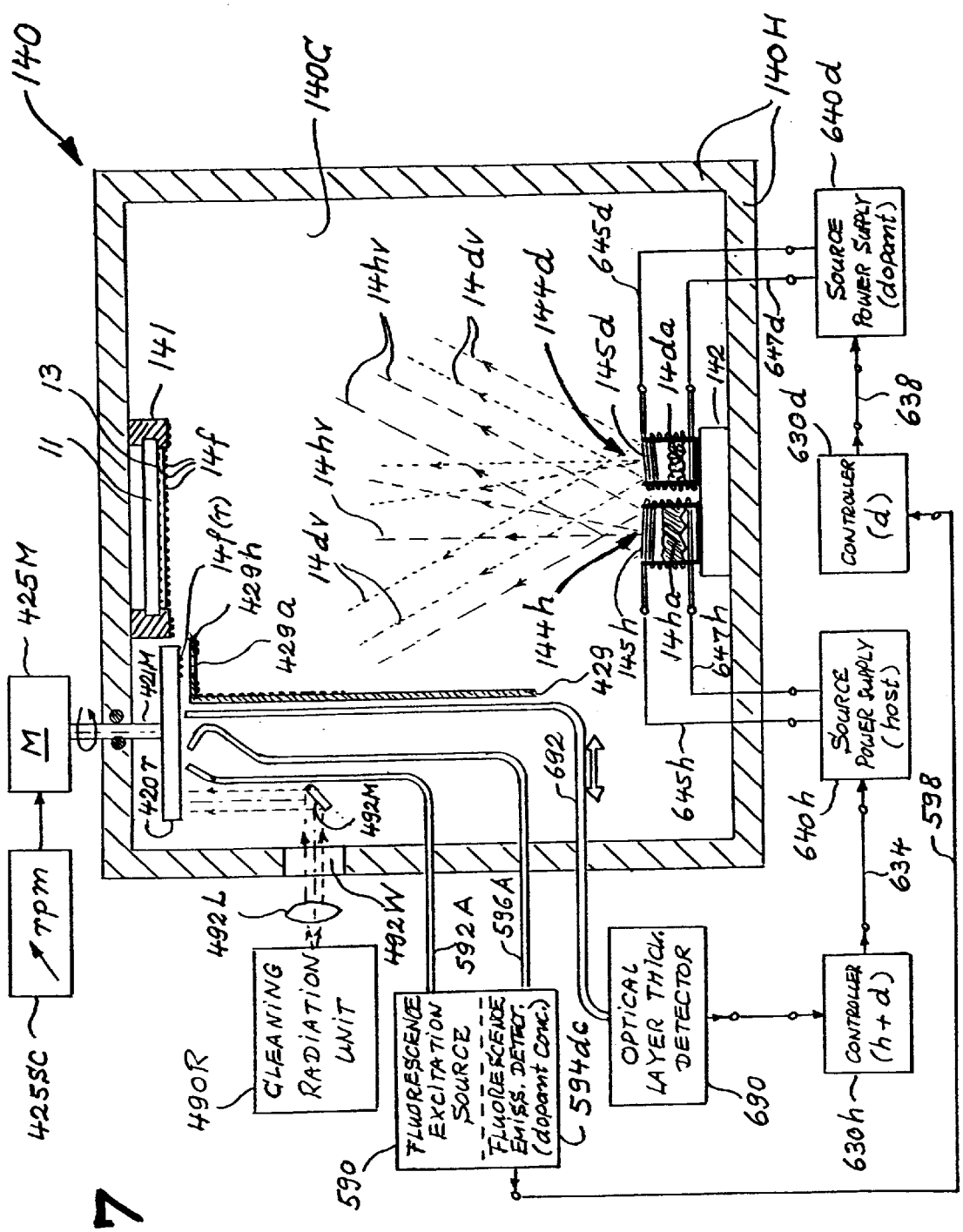
FIG. 17 shows schematically a sectional view of the LEL deposition station of FIG. 2 in which a doped organic light-emitting layer is being formed on a structure and on a rotating disc by vapor co-deposition from a controllable host material source and a controllable dopant material source, and wherein a fluorescence emission detector is used to measure and to control a dopant concentration in the organic light-emitting layer, in accordance with an aspect of the present invention.

FIG. 17 is a schematic sectional view of the station 140 of FIG. 2 in which vapor co-deposition of a doped organic light-emitting layer from a controlled host material source 144h and from a controlled dopant material source 144d is shown in a deposition zone defined by vapor streams 14hv (host vapor) and 14dv (dopant vapor).

Parts with like numeral designations in FIG. 17 correspond to like parts and their function descried with reference to FIGS. 6, 6A, and 11. For example, the optical layer thickness detector 690 of FIG. 17 has been described with reference to FIG. 6, and the cleaning radiation unit 490R has been described with reference to FIG. 11. Accordingly, the description of FIG. 17 will highlight features which differ from previously described embodiments of the invention.

A host source 144h is charged with an organic light-emitting host material 14ha which is sublimed or evaporated from this source by heating the source via a host source heating element 145h which, in turn, receives electrical power from a source power supply 640h via leads 645h and 647h. The source power supply 640h is controlled by a controller or amplifier 630h in response to an output signal from an optical layer thickness detector as described previously.

A dopant source 144d is charged with an organic dopant material 14da which is sublimed or evaporated from this source by heating the source via a dopant source heating element 145d which, in turn, receives electrical power from a source power supply 640d via leads 645d and 647d. The source power supply 640d is controlled by a controller or amplifier 630d via lead 638 in response to an output signal from a fluorescence emission detector 594dc provided via a lead 598.

The distinguishing features of the apparatus of FIG. 17 are:

(i) the fluorescence emission detector 594dc is calibrated to measure a dopant concentration within the layer 14f(r) of doped organic light-emitting deposit being formed on the rotating disc 420r via the aperture 429a in the horizontal portion 429h of the shield 429. Stated differently, the fluorescence emission detector 594dc analyzes (via the angled optical fiber conduit 596A) the fluorescence light emission (from the layer 14f(r) on the disc) within a spectral region which is uniquely attributable to a hue or color of light provided by the dopant. An intensity of such dopant-induced fluorescence light emission can be calibrated to correspond to a concentration of dopant in the light-emitting layer.

A dopant concentration in a range from 0.1–1.5 mole percent in a light-emitting layer of an organic host material layer can profoundly influence the hue shift and the intensity of hue-shifted fluorescence emission. Therefore, optical detection of, and control of dopant concentration is an important aspect of this embodiment of the invention; and (ii) within the above-noted range of dopant concentration, the effect of dopant concentration on a thickness of a doped organic layer 14f(r) being formed on the rotating disc 420r (and being formed as the layer 14f on the structure 11) is relatively small. Thus, the optical layer thickness detector 690 measures a thickness of the layer 14f(r) being formed on the rotating disc and provides a thickness-related output signal which is used to control sublimation or evaporation of organic light-emitting host material 14ha from the host source 144h in a manner described above.

The fluorescent emission from the dopant will in general appear on a different time scale than the host material fluorescence. This enables the differentiation of fluorescence between host and dopant on the basis of time discrimination techniques utilizing modulated light sources in addition to spectral differences. Such time discrimination techniques are well known to those skilled in the art.

It will be appreciated that a disc assembly, or a belt assembly, can be effectively incorporated into each one of the vapor deposition stations 130, 140, and 150 of the OLED manufacturing system 100 shown in FIG. 2. Thus, each of these stations can provide control and/or adjustment of a vapor deposition rate of organic material, and to provide reusable surfaces for optical sensing by complete or partial removal of organic material from a disc or a belt in a cleaning position along a path of motion of a movable member or of a moving member, such as a disc or a belt.

The invention has been described in detail with particular reference to certain preferred embodiments thereof, but it will be understood that variations and modifications can be effected within the spirit and scope of the invention.

PARTS LIST 10 organic light-emitting device (OLED)
11 substrate or structure
12 first electrodes
13 organic hole-transporting layer (HTL)
14 organic light-emitting layer (LEL)
14(×N) number N of organic light-emitting layers on mass-sensor
14a organic light-emitting material
14b level of organic light-emitting material
14v deposition zone of vapor of organic light-emitting material
14f organic light-emitting layer being formed
14f-1 organic light-emitting layer being formed in a time interval $\Delta t_1$
14f-2 organic light-emitting layer being formed in a time interval $\Delta t_2$
14f(r) organic light-emitting layer being formed via an aperture on a continuously rotating disc
1×14f(r) organic light-emitting layer being formed on a continuously rotating disc during one pass over an aperture
2×14f(r) organic light-emitting layer being formed on a continuously rotating disc during two passes over an aperture
n×f(r) organic light-emitting layer being formed during n passes over an aperture
15 organic electron-transporting layer (ETL)
16 second electrodes
18 encapsulation or cover
100 OLED manufacturing system
102 buffer hub
103 unload station
104 transfer hub
105 connector port
106 vacuum pump
107 pumping port
108 pressure gauge
110 load station
110C chamber
110H housing
111 carrier (for substrates or structures)
130 vapor deposition station (organic HTL)
140 vapor deposition station (organic LEL)
140C chamber
140H housing
141 holder and/or mask frame
142 thermally insulative support
144 source
145 heating element(s)
150 vapor deposition station (organic ETL)
160 vapor deposition station (second electrodes)
170 storage station
180 encapsulation station
200 crystal mass sensor (PRIOR ART)
202 electrically grounded casing
204 crystal
205 front electrode
206 rear electrode
207 connection to rear electrode
209 connection to casing (and to front electrode)
210 lead
216 input terminal
220 deposition rate monitor
222 output terminal
224 lead
226 input terminal
230 controller or amplifier
232 output terminal
234 lead
236 input terminal
240 source (heating) power supply
244 output terminal
245 lead
246 output terminal
247 lead
400 disc assembly
400r rotating disc assembly
420 disc
420-1 first disc surface
420-2 second disc surface
420r continuously rotating disc 421 shaft
421M motor drive shaft
422 shutter
425 rotator
425M motor
425SC motor speed controller
427 seal
429 shield
429a aperture
429h horizontal extension of shield
490 cleaning flash unit
490R cleaning radiation unit
491 radiation-absorbing layer
492 light guide
492L lens or lenses
492M mirror
492W radiation-transmissive window
590 fluorescence excitation source
592 optical fiber conduit
592A angled optical fiber conduit
594 fluorescence emission detector
596 optical fiber conduit
596A angled optical fiber conduit
626 input terminal
630 controller or amplifier
632 output terminal
634 lead
636 input terminal (source power supply)
640 source (heating) power supply
644 output terminal
645 lead
646 output terminal
647 lead
690 optical layer thickness detector
692 optical fiber conduit
692-1 input optical fiber conduit
692-2 output optical fiber conduit
692-S seal(s)
694 output terminal
700 belt assembly
720 continuous belt
722 shutter
729 shield
790 heated cleaning roller
792 heater
793 heating lamp
794 belt drive roller
795 reflector
796 idle roller
797 idle roller
798 chill roller
14da organic dopant material
14ha organic light-emitting host material
14dv deposition zone of vapor of organic dopant material
14hv deposition zone of vapor of organic light-emitting host material
14f1(r) organic light-emitting layer being formed on a continuously rotating disc during one pass over a first aperture
14f2(r) organic light-emitting layer being formed on a continuously rotating disc during one pass over a second aperture
14f4(r) organic light-emitting layer being formed on a continuously rotating disc during one pass over a third aperture
144d dopant source
144h host source
145d dopant source heating element
145h host source heating element
429a1 first aperture
429a2 second aperture
429a4 third aperture
429hm horizontal extension of shield with multiple apertures
594dc fluorescence emission detector for measuring dopant concentrations
598 lead
630d controller or amplifier (dopant)
630h controller or amplifier (host+dopant)
638 lead
640d source (heating) power supply for dopant source
640h source (heating) power supply for host source
645d lead (to dopant source)
645h lead (to host source)
647d lead (to dopant source)
647h lead (to host source)
690m optical layer thickness detector with multiple optical fiber inputs
692a1 optical fiber conduit associated with aperture 429a1
692a2 optical fiber conduit associated with aperture 429a2
692a4 optical fiber conduit associated with aperture 429a4

What is claimed is:

1. Apparatus for depositing an evaporated or sublimed organic layer onto a structure which will provide part of an organic light-emitting device, comprising:

a) a housing defining a chamber and a pump connected to the chamber for reducing the pressure therein;

b) a source for receiving organic material to be evaporated or sublimed and means connected to the source for adjusting the temperature thereof to control the rate at which the organic material is evaporated or sublimed;

c) means for positioning the structure so that such structure is located spaced from the source in a deposition zone;

d) a moving member moving through a plurality of positions along a path of motion;

e) the moving member in a first position having a portion thereof positioned in the deposition zone for receiving organic material from the source at the same time such organic material is deposited onto the structure;

f) first optical sensing means in a second position disposed relative to the moving member outside the deposition zone for sensing a thickness of the organic material deposited on the portion of the moving member;

g) electrical means connected to the first optical sensing means and responsive to the thickness of the organic material sensed by the first optical sensing means;

h) means for adjusting the temperature control means to control the rate of deposition and the thickness of the organic layer formed on the structure; and i) cleaning means disposed in a third position along the path of motion of the member outside the deposition zone beyond the first optical sensing means for removing in whole or in part organic material deposited on the portion of the member so that such portion can be reused in the deposition zone.

2. The apparatus of claim 1 wherein the moving member includes a rotating disc and the portion positioned in the deposition zone is defined by an aperture.

3. The apparatus of claim 2 wherein the rotating disc is constructed of a disc material including glass, quartz, ceramic, silicon, or metal.

4. The apparatus of claim 2 wherein the first optical sensing means includes at least one optical fiber conduit for directing illumination towards the portion having the deposited organic material and for receiving a fraction of such illumination from the organic material for computation in the electrical means of a thickness of the organic material deposited in the deposition zone.

5. The apparatus of claim 1 further including second and third optical sensing means disposed relative to the moving member outside the deposition zone beyond the first optical sensing means and ahead of the cleaning means, wherein the second optical sensing means includes means for directing fluorescence-excitation radiation towards the portion having the deposited organic material, and the third optical sensing means includes means for receiving fluorescence-emission radiation from the organic material for determination of a fluorescence efficacy of such deposited organic material.

6. The apparatus of claim 2 wherein the cleaning means includes means for directing cleaning radiation towards the portion of the disc having the deposited organic material.

7. The apparatus of claim 6 further including a radiation-absorbing layer preformed on the disc.

8. The apparatus of claim 1 wherein the moving member includes a moving belt and is adapted to move a portion of the belt to be positioned in the deposition zone defined by an aperture.

9. The apparatus of claim 8 wherein the moving belt is constructed of a metal.

10. The apparatus of claim 8 wherein the cleaning means includes a heating lamp for directing heat-radiation towards the portion of the organic material deposited on the belt.

11. The apparatus of claim 10 further including means for cooling the belt in a position along the path of motion beyond the position of the cleaning means and ahead of the position in the deposition zone.

12. The apparatus of claim 11 wherein the means for cooling includes a chill roller in contact with the belt on a surface thereof which is opposed to a surface of the belt having the portion for receiving the organic material.

13. Apparatus for depositing an evaporated or sublimed organic layer onto a structure which will provide part of an organic light-emitting device, comprising:
   a) a housing defining a chamber and a pump connected to the chamber for reducing the pressure therein;
   b) a source for receiving organic material to be evaporated or sublimed and means connected to the source for adjusting the temperature thereof to control the rate at which the organic material is evaporated or sublimed;
   c) means for positioning the structure so that such structure is located spaced from the source in a deposition zone;
   d) a movable member movable, in sequence, into a plurality of positions along a path of motion;
   e) the movable member in a first position having a portion thereof positioned in the deposition zone for receiving organic material from the source for at least a fraction of time such organic material is deposited onto the structure;
   f) first optical sensing means disposed in a second position relative to the movable member outside the deposition zone for sensing a thickness of the organic material deposited on the portion of the movable member;
   g) electrical means connected to the first optical sensing means and responsive to the thickness of the organic material sensed by the first optical sensing means;
   h) means for adjusting the temperature control means to control the rate of deposition and the thickness of the organic layer formed on the structure; and
   i) in a third position cleaning means disposed along the path of motion of the member outside the deposition zone beyond the first optical sensing means for removing in whole or in part organic material deposited on the portion of the member so that such portion can be reused in the deposition zone.

14. The apparatus of claim 13 wherein the movable member includes a rotatable disc and the portion positioned in the deposition zone is defined by an aperture in a shutter when the shutter is opened.

15. The apparatus of claim 14 wherein the rotatable disc is constructed of a disc material including glass, quartz, ceramic, silicon, or metal.

16. The apparatus of claim 14 wherein the first optical sensing means includes at least one optical fiber conduit for directing illumination towards the portion having the deposited organic material and for receiving a fraction of such illumination from the organic material for computation in the electrical means of a thickness of the organic material deposited in the deposition zone during a selected deposition time.

17. The apparatus of claim 13 further including second and third optical sensing means disposed relative to the movable member outside the deposition zone beyond the first optical sensing means and ahead of the cleaning means, wherein the second optical sensing means includes means for directing fluorescence-excitation radiation towards the portion having the deposited organic material, and the third optical sensing means includes means for receiving fluorescence-emission radiation from the organic material for determination of a fluorescence efficacy of such deposited organic material.

18. The apparatus of claim 14 wherein the cleaning means includes means for directing cleaning radiation towards the portion of the disc having the deposited organic material.

19. The apparatus of claim 18 wherein the cleaning radiation includes flashed radiation.

20. The apparatus of claim 18 further including a radiation-absorbing layer preformed on the disc.

21. The apparatus of claim 13 wherein the movable member includes a translatable belt and is adapted to move a portion of the belt to be positioned in the deposition zone defined by an aperture in a shutter when the shutter is opened.

22. The apparatus of claim 21 wherein the translatable belt is constructed of a metal.

23. The apparatus of claim 21 wherein the cleaning means includes a heated cleaning roller in contact with the belt on a surface thereof which is opposed to a surface of the belt having the portion for receiving the organic material.

24. The apparatus of claim 23 further including means for cooling the belt in a position along the path of motion beyond the position of the cleaning means and ahead of the position in the deposition zone.

25. The apparatus of claim 24 wherein the means for cooling includes a chill roller in contact with the belt on a surface contacted by the heated cleaning roller.

26. The apparatus of claim 21 wherein the cleaning means includes a heating lamp for directing heat-radiation towards the portion of the organic material deposited on the belt.

27. The apparatus of claim 26 wherein the heating lamp includes a reflector, the reflector adapted as a trap for collecting organic material removed from the portion of the belt by the cleaning means.

28. The apparatus of claim 1 wherein the moving member receives organic material from the source in the portion positioned in the deposition zone and defined by at least two spaced-apart apertures having different dimensions along the path of motion of the moving member.

29. The apparatus of claim 28 wherein the first optical sensing means in the second position includes optical sensing means for sensing a thickness of the organic material deposited on the portion of the moving member through each of the at least two spaced-apart apertures.

30. The apparatus of claim 29 wherein the electrical means connected to the first optical sensing means is responsive to a thickness difference between organic material deposited on the moving member through each of the at least two apertures having the different dimensions along the path of motion.

31. Apparatus for depositing an evaporated or sublimed layer of a doped organic host material onto a structure which will provide part of an organic light-emitting device, comprising:

a) a housing defining a chamber and a pump connected to the chamber for reducing the pressure therein;

b) a host source for receiving organic host material to be evaporated or sublimed and means connected to the host source for adjusting the temperature thereof to control the rate at which the host material is evaporated or sublimed;

c) a dopant source for receiving organic dopant material to be evaporated or sublimed at the same time the organic host material is evaporated or sublimed and means connected to the dopant source for adjusting the temperature thereof to control the rate at which the organic dopant material is evaporated or sublimed;

d) means for positioning the structure so that such structure is located spaced from the host source and the dopant source in a deposition zone;

e) a moving member moving through a plurality of positions along a path of motion;

f) the moving member in a first position having a portion thereof positioned in the deposition zone for receiving organic host material and organic dopant material from the corresponding sources at the same time such organic host material and organic dopant material is deposited onto the structure;

g) first optical sensing means disposed in a second position relative to the moving member outside the deposition zone for sensing a thickness of the doped organic host material deposited on the portion of the moving member;

h) electrical means connected to the first optical sensing means and responsive to the thickness of the doped organic host material sensed by the first optical sensing means;

i) means for adjusting the temperature control means connected to the host source to control the rate of deposition and the thickness of the doped organic host layer formed on the structure;

j) second and third optical sensing means disposed in a third position relative to the moving member outside the deposition zone, wherein the second optical sensing means includes means for directing fluorescence-excitation radiation towards the portion having the deposited doped organic host material, and the third optical sensing means includes means for receiving fluorescence-emission radiation from the doped organic host material, such fluorescence-emission radiation corresponding to a concentration of the organic dopant material contained in the organic host material;

k) electrical means connected to the third optical sensing means and responsive to the concentration of the organic dopant material contained in the organic host material sensed by the third optical sensing means;

l) means for adjusting the temperature control means connected to the dopant source to control the rate of deposition of the dopant material and the concentration of the dopant material in the layer of the doped organic host material formed on the structure; and m) in a fourth position cleaning means disposed along the path of motion of the member outside the deposition zone for removing in whole or in part organic material deposited on the portion of the moving member so that such portion can be reused in the deposition zone.

32. The apparatus of claim 31 wherein the fluorescence-excitation radiation source is modulated and said means for receiving fluorescence-emission radiation includes a means for time discrimination.

* * * * *